(12) United States Patent
Naito et al.

(10) Patent No.: US 7,732,038 B2
(45) Date of Patent: Jun. 8, 2010

(54) ELECTROMAGNETIC WAVE SHIELDING FILTER

(75) Inventors: Nobuo Naito, Tokyo-to (JP); Fumihiro Arakawa, Tokyo-to (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 533 days.

(21) Appl. No.: 11/597,744

(22) PCT Filed: Jul. 8, 2005

(86) PCT No.: PCT/JP2005/012665

§ 371 (c)(1),
(2), (4) Date: Nov. 28, 2006

(87) PCT Pub. No.: WO2006/006527

PCT Pub. Date: Jan. 19, 2006

(65) Prior Publication Data

US 2007/0231587 A1    Oct. 4, 2007

(30) Foreign Application Priority Data

Jul. 12, 2004    (JP) .............................. 2004-204767

(51) Int. Cl.
*B32B 3/24* (2006.01)
*H05K 9/00* (2006.01)

(52) U.S. Cl. .................. 428/138; 174/392; 174/389

(58) Field of Classification Search ................. 428/138; 174/392, 389
See application file for complete search history.

(56) References Cited

U.S. PATENT DOCUMENTS 6,515,868 B1    2/2003    Takahashi et al.
6,621,003 B2    9/2003    Yoshida et al.
2003/0164243 A1    9/2003    Arakawa et al.
2005/0244608 A1    11/2005    Arakawa et al.
2006/0008597 A1    1/2006    Zagdoun

FOREIGN PATENT DOCUMENTS

| | | |
|---|---|---|
| JP | A 57-021458 | 2/1982 |
| JP | A 60-043605 | 3/1985 |
| JP | A 60-236131 | 11/1985 |
| JP | A 61-032003 | 2/1986 |
| JP | A 61-115958 | 6/1986 |
| JP | A 61-291651 | 12/1986 |
| JP | A 62-132963 | 6/1987 |
| JP | A 62-187302 | 8/1987 |
| JP | A 01-172458 | 7/1989 |
| JP | A 01-278800 | 11/1989 |

(Continued)

*Primary Examiner*—William P Watkins, III
(74) *Attorney, Agent, or Firm*—Oliff & Berridge, PLC

(57) ABSTRACT

An electromagnetic wave shielding filter 10 comprises a transparent substrate 1, and a mesh layer 3 containing an electrically conductive layer 2, formed on the transparent substrate 1 with a transparent adhesive layer 9. A transparent colored resin layer 4 containing a coloring agent is formed on the mesh layer 3, with a transparent barrier layer 5 interposed between the two layers. An anticorrosive layer 6 and a blackening layer 7 are formed on the electrically conductive layer 2 in the mesh layer 3. The transparent colored resin layer 4 also serves as an adhesive layer, and a functional layer 8, such as an optical filter, a protective sheet, or a display front substrate, is further laminated to the transparent colored resin layer 4.

11 Claims, 5 Drawing Sheets

FOREIGN PATENT DOCUMENTS

| | | |
|---|---|---|
| JP | A 04-174403 | 6/1992 |
| JP | A 05-178808 | 7/1993 |
| JP | A 05-295967 | 11/1993 |
| JP | A 05-323101 | 12/1993 |
| JP | A 08-120186 | 5/1996 |
| JP | A 09-279125 | 10/1997 |
| JP | A 09-310031 | 12/1997 |
| JP | A 10-338848 | 12/1998 |
| JP | A 2001-210988 | 8/2001 |
| JP | A 2002-326305 | 11/2002 |
| JP | A 2003-318596 | 11/2003 |
| JP | A 2004-053799 | 2/2004 |
| JP | A 2004-069931 | 3/2004 |
| JP | A 2004-146536 | 5/2004 |
| JP | A 2004-241761 | 8/2004 |
| JP | A 2004-281839 | 10/2004 |
| TW | 200405790 | 4/2004 |
| TW | 200405941 | 4/2004 |

ELECTROMAGNETIC WAVE SHIELDING FILTER

FIELD OF THE INVENTION

The present invention relates to an electromagnetic wave shielding filter having light transmission properties, and, more particularly, to an electromagnetic wave shielding filter that also functions as an optical filter and is suitable especially for use with such a display as a PDP.

BACKGROUND ART

There have been known electromagnetic wave shielding filters that are mounted on the front of a variety of displays, such as PDPs (plasma display panels) and CRT (cathode ray tube) displays, in order to shield electromagnetic waves that the displays generate. The electromagnetic wave shielding filters to be used for this purpose are required to have not only electromagnetic wave shielding properties but also light transmission properties. However, this requirement cannot fully be satisfied by an electromagnetic wave shielding filter produced by forming an ITO (indium tin oxide) film on the entire surface of a transparent substrate (see Patent Documents 1 and 2, for example). Accordingly, there has been proposed an electromagnetic wave shielding filter comprising metal foil, such as copper foil, laminated to a transparent resin film substrate by an adhesive, etched into a mesh (see Patent Document 3, for example).

Patent Document 1: Japanese Laid-Open Patent Publication No. 278800/1989,

Patent Document 2: Japanese Laid-Open Patent Publication No. 323101/1993, and

Patent Document 3: Japanese Laid-Open Patent Publication No. 210988/2001.

Further, front filters or the like to be mounted on the front of displays are sometimes required to have not only the function of shielding electromagnetic waves but also other functions such as the function of shielding unwanted light that displays radiate (for example, when mounted on PDPs, light with wavelengths around 590 nm produced by neon emission) to compensate for the color tone of displayed images for enhancing color reproducibility, the function of preventing unwanted reflection of extraneous light, and the function of suppressing unwanted radiation of infrared rays from displays to avoid malfunction of infrared ray equipment. Furthermore, the front filters are also required to be light in weight and small in thickness. Therefore, when an electromagnetic wave shielding filter has only the function of shielding electromagnetic waves, it is often made into a composite filter, for practical use, by integrally laminating it to a filter having another function, such as an antireflection filter, a coloring filter, or an infrared absorption filter (see Patent Documents 2 and 3, for example).

In the case where a coloring filter containing a coloring agent is laminated to an electromagnetic wave shielding filter for the purpose of shielding unwanted visible light and infrared rays that a display itself radiates, or unwanted light such as extraneous light (reflection), no problem has occurred as long as a coloring filter with a transparent substrate is simply laminated to a mesh layer in an electromagnetic wave shielding filter by an adhesive such as a pressure-sensitive adhesive, with the transparent substrate of the coloring filter facing to the mesh layer. FIG. 7(A) shows an example of a conventional electromagnetic wave shielding filter 20 having the above-described structure, that is, an electromagnetic wave shielding composite filter 20 in which a functional layer 8, such as an optical filter, composed of a transparent substrate 8B and a functioning layer 8A formed on the transparent substrate 8B is laminated to a mesh-laminated sheet 21 composed of a transparent substrate 1 and a mesh layer 3 laminated to the transparent substrate 1 with an adhesive layer 22 containing no coloring agent, with the transparent substrate 8B of the functional layer 8 facing to the mesh layer 3 of the mesh-laminated sheet 21. The functioning layer 8A is, for example, a transparent resin layer in which a near infrared absorber has been incorporated so that the layer has the function of absorbing near infrared rays, and, in this case, the functional layer 8 serves as a near infrared absorption filter.

In this structure, the functioning layer 8A is isolated from the metal mesh layer 3 by the transparent substrate 8B and the adhesive layer 22. Therefore, even if the functioning layer 8A has the possibility that it might undergo a change in color when it interacts with the mesh layer, no such interaction actually occurs due to the transparent substrate 8B and the adhesive layer 22.

However, in order to make the electromagnetic wave shielding composite filter lighter in weight and smaller in thickness, and to decrease the number of the constituent layers of the composite filter (which leads to decrease in cost and haze and to improvement in light transmission properties), if the adhesive that is applied when the electromagnetic wave shielding filter and the functional layer such as the above-described coloring filter are laminated is colored with a coloring agent so that the adhesive layer can also serve as a coloring filter, another problem has newly occurred. Namely, it was found that an adhesive colored with a coloring agent undergoes a change in color (discolors or fades) with time.

FIG. 7(B) shows an example of a conventional electromagnetic wave shielding filter 20 having the above-described structure, that is, an electromagnetic wave shielding composite filter 20 in which a functional layer 8, such as an optical filter, composed of a transparent substrate 8B and a functioning layer 8A formed on the transparent substrate 8B is laminated to a mesh-laminated sheet 21 composed of a transparent substrate 1 and a mesh layer 3 laminated to the transparent substrate 1 with a transparent colored resin layer 4 serving also as an adhesive layer, made from a transparent resin to which a coloring agent serving as a neon light absorber, for example, has been added so that the resin layer has the function of cutting neon light, with the transparent substrate 8B of the functional layer 8 facing to the mesh layer 3 of the mesh-laminated sheet 21. The functioning layer 8A is, for example, a layer of a transparent resin in which a near infrared absorber has been incorporated so that the layer has the function of absorbing near infrared rays, and the functional layer 8 thus functions as a near infrared absorption filter. In this case, it was found that the neon-light-cutting properties deteriorate with time, or that unfavorable coloring (discoloration) occurs.

It was also found that the coloring agent tends to cause color deterioration especially when a transparent adhesive layer 9 is present between the transparent substrate 1 and the mesh layer 3, or when the mesh layer 3 contains a blackening layer 7, as shown in FIG. 7(C).

SUMMARY OF THE INVENTION

An object of the present invention is, therefore, to prevent an electromagnetic wave shielding filter comprising an electrically conductive layer in the form of a mesh from undergoing a change in color with time even when its constituent resin layer made from an adhesive or the like has been colored by a coloring agent so that the electromagnetic wave shielding filter also functions as a coloring filter.

The present invention is an electromagnetic wave shielding filter comprising a transparent substrate, a mesh layer in the form of a mesh, containing at least an electrically conductive layer, formed on the transparent substrate, and a transparent colored resin layer containing a coloring agent, formed on the mesh layer, a transparent barrier layer that separates the mesh layer and the transparent colored resin layer from each other being present between the mesh layer and the transparent colored resin layer.

When the electromagnetic wave shielding filter has the above-described structure, since the transparent barrier layer prevents the transparent colored resin layer containing the coloring agent and the mesh layer containing the electrically conductive layer from coming into direct contact, the transparent colored resin layer undergoes no change in color with time.

The present invention is the electromagnetic wave shielding filter in which the mesh layer contains an anticorrosive layer formed at least on one side of the electrically conductive layer.

When the structure of the electromagnetic wave shielding filter is so made, even if the electrically conductive layer is made from a metal that rusts easily, since it is covered with the anticorrosive layer, it scarcely rusts, and the electromagnetic wave shielding properties last long.

The present invention is the electromagnetic wave shielding filter in which the mesh layer contains a blackening layer formed at least on one side of the electrically conductive layer.

By so making the structure of the electromagnetic wave shielding filter, it is possible to prevent the electrically conductive layer face from causing unwanted reflection of light such as extraneous light and thus increase the contrast of an image displayed on a display.

The present invention is the electromagnetic wave shielding filter in which the mesh layer contains a blackening layer, the electrically conductive layer, and an anticorrosive layer that are situated in this order, with the blackening layer on the transparent substrate side.

The present invention is the electromagnetic wave shielding filter in which the mesh layer contains the electrically conductive layer, a blackening layer, and an anticorrosive layer that are situated in this order, with the electrically conductive layer on the transparent substrate side.

The present invention is the electromagnetic wave shielding filter in which the mesh layer contains a first anticorrosive layer, a blackening layer, the electrically conductive layer, a blackening layer, and a second anticorrosive layer that are situated in this order, with the first anticorrosive layer on the transparent substrate side.

The present invention is the electromagnetic wave shielding filter in which the mesh layer contains a first anticorrosive layer, the electrically conductive layer, a blackening layer, and a second anticorrosive layer that are situated in this order, with the first anticorrosive layer on the transparent substrate side.

The present invention is the electromagnetic wave shielding filter in which the mesh layer contains the electrically conductive layer, and a blackening layer that covers a face (surface) of the electrically conductive layer on the side opposite to the transparent substrate side and the side faces (surfaces) of the electrically conductive layer.

The present invention is the electromagnetic wave shielding filter in which the transparent colored resin layer functions as an adhesive layer, and a functional layer is laminated to the transparent colored resin layer.

When the structure of the electromagnetic wave shielding filter is so made, it is possible to laminate, as the functional layer, the following article to the transparent colored resin layer that functions also as an adhesive layer: a filter other than an electromagnetic wave shielding filter, such as an antireflection filter, an antistatic filter, or a coloring filter; a component part of a display itself, such as a display front substrate; a protective sheet; or the like.

The present invention is the electromagnetic wave shielding filter further comprising a transparent adhesive layer between the transparent substrate and the mesh layer.

This structure is an example of the case where the electrically conductive layer in the mesh layer is made by etching metal foil laminated to the transparent substrate. In this case, since the transparent barrier layer also covers the transparent adhesive layer, even if the transparent adhesive layer contains a substance that unfavorably contributes to discoloration, it is possible to prevent discoloration that is caused by such a substance.

The present invention is an electromagnetic wave shielding filter comprising a transparent substrate, a transparent adhesive layer made from a urethane adhesive, formed on the transparent substrate, a mesh layer in the form of a mesh, containing at least an electrically conductive layer made from a metal, formed on the transparent adhesive layer, and a transparent colored resin layer containing a coloring agent and an adhesive, formed on the mesh layer, a transparent barrier layer for separating the mesh layer and the transparent colored resin layer from each other, made from a non-urethane, non-adhesive solid resin, being present between the mesh layer and the transparent colored resin layer.

The present invention is the electromagnetic wave shielding filter in which the mesh layer contains a blackening layer formed, either directly or through an anticorrosive layer, on one or more faces selected from a face the electrically conductive layer on the transparent substrate side, a face of the electrically conductive layer on the side opposite to the transparent substrate side, and the side faces of the electrically conductive layer.

When the structure of the electromagnetic wave shielding filter is so made, even if the materials for and the lamination of the electromagnetic wave shielding filter inherently cause color deterioration of the coloring agent, it is possible to prevent, with certainty, the transparent colored resin layer from undergoing a change in color with time.

Namely, in the case of the above-described structure, the resin used to form the transparent colored resin layer is a semi-fluid, pressure-sensitive adhesive in which a coloring agent can easily move. Moreover, the layer that will come into contact with the coloring agent moving in the transparent colored resin layer is made from a material that reacts with the coloring agent to readily undergo a change in color. Specifically, the transparent adhesive layer is made from a urethane resin that can react with a variety of coloring agents to cause discoloration, and the mesh layer is made from a metal that chemically reacts with the coloring agent or acts as a catalyst for chemical reactions (or the mesh layer further contains a blackening layer and an anticorrosive layer that may react chemically with the coloring agent or act as catalysts).

Color deterioration of the coloring agent is thus unavoidable, unless a special measure is taken. In the present invention, however, the transparent barrier layer is made from a non-pressure-sensitive-adhesive solid resin in which a coloring agent cannot easily move, and the transparent barrier layer itself is also made from a resin selected from resins other than urethane resins that easily react with a coloring agent to cause discoloration.

For this reason, even when the electromagnetic wave shielding filter has such a structure that color deterioration of a coloring agent easily occurs, the transparent barrier layer prevents color deterioration of the coloring agent with certainty.

(1) According to the present invention, even if the electromagnetic wave shielding filter comprises, as a coloring filter, a transparent colored resin layer containing a coloring agent, together with a mesh layer containing an electrically conductive layer made from copper or the like, it is possible to prevent the transparent colored resin layer from undergoing a change in color with time. The original performance of the coloring filter can therefore be maintained for a long period of time; for example, the coloring filter serves to improve the reproducibility of color of a displayed image and this function lasts long.

(2) Further, when an anticorrosive layer is formed on either of the two surfaces of the electrically conductive layer, even if a metal that rusts easily is used to form the electrically conductive layer, this layer scarcely corrodes, and its electromagnetic wave shielding properties, etc. thus last long.

Furthermore, when a blackening layer is formed on either of the two surfaces of the electrically conductive layer, this blackening layer prevents the electrically conductive layer face from reflecting light, so that the contrast of an image displayed on a display screen is improved.

(3) Furthermore, by further laminating a functional layer by the use of the transparent colored resin layer as an adhesive layer, it is possible to obtain an electromagnetic wave shielding filter into which the following article has been integrated as the functional layer: a filter other than an electromagnetic wave shielding filter, such as an antireflection filter or an antistatic filter; a component part of a display, such as a display front substrate; a protective sheet; or the like.

(4) Furthermore, in the structure in which a transparent adhesive layer is present on the transparent substrate including the openings in the mesh layer, between the transparent substrate and the mesh layer, even if the transparent adhesive layer contains a substance that unfavorably contributes to discoloration, it is possible to prevent discoloration that occurs due to this substance.

(5) Moreover, even when the electromagnetic wave shielding filter has such a structure that color deterioration of the coloring agent contained in the transparent colored resin layer inherently occurs, that is, the coloring agent can easily move in the transparent colored resin layer, and, at the same time, that another layer with which the moving coloring agent comes in contact contains a substance that readily reacts with the coloring agent or acts as a catalyst in the reaction of the coloring agent, if a urethane adhesive is selected for the transparent adhesive, a metal, for the electrically conductive material for the mesh layer, a pressure-sensitive adhesive, for the resin for the transparent colored resin layer, and a non-urethane, non-pressure-sensitive-adhesive solid resin, for the transparent barrier layer, and these materials are used in combination, or if, in addition to the above, the mesh layer contains one of or both of a blackening layer and an anticorrosive layer, it is possible to effectively prevent color deterioration of the coloring agent.

BEST MODE FOR CARRYING OUT THE INVENTION

Figure 1:
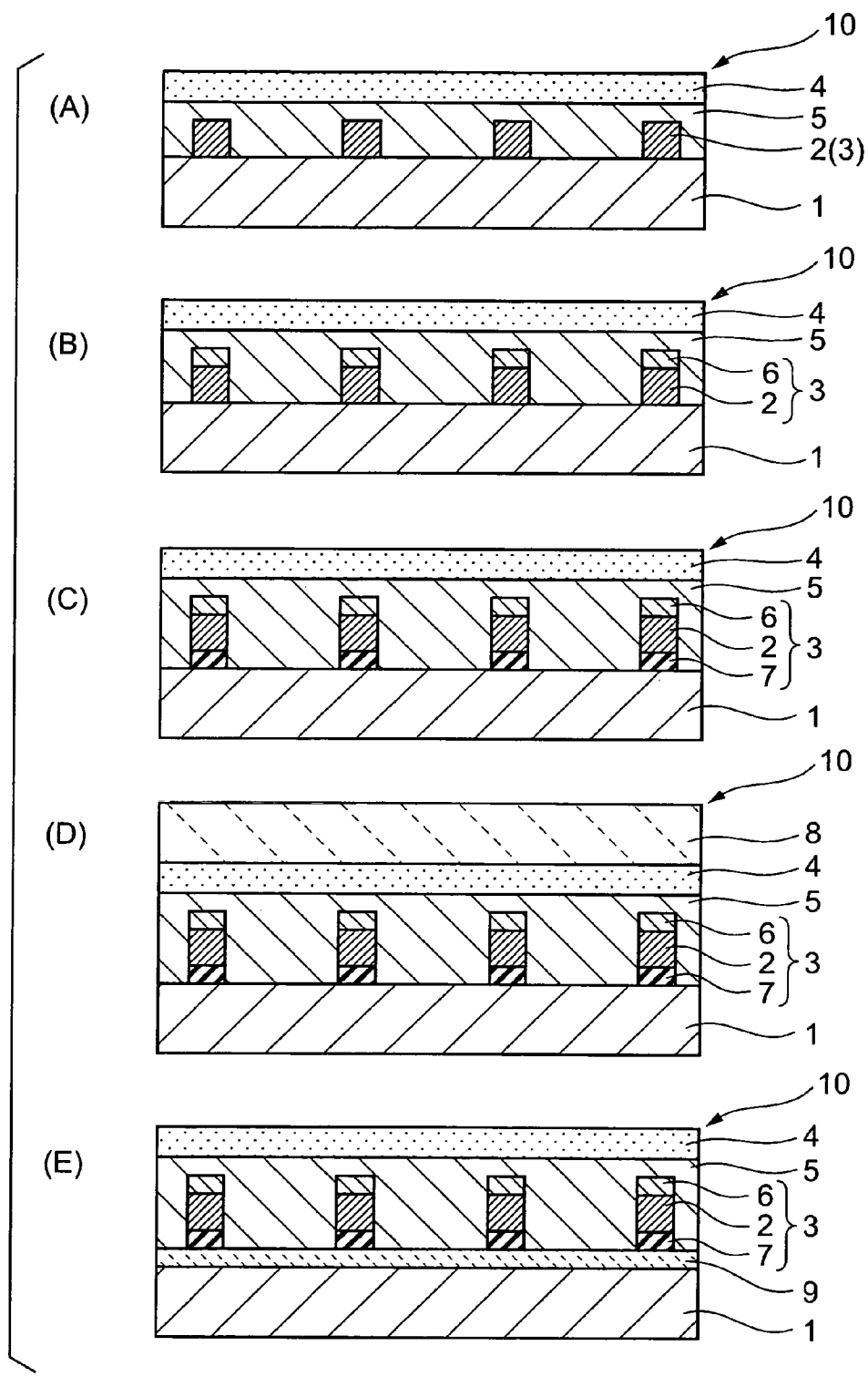
FIGS. 1(A) to 1(E) are sectional views illustrating some forms of electromagnetic wave shielding filters according to the present invention.

The best mode for carrying out the present invention will be described hereinafter with reference to the accompanying drawings.

FIGS. 1(A) to 1(E) are sectional views illustrating some basic forms of electromagnetic wave shielding filters according to the present invention.

An electromagnetic wave shielding filter 10 shown in FIG. 1(A) is in the most basic form, and comprises a transparent substrate 1, a mesh layer 3 in the form of a mesh, containing an electrically conductive layer 2, formed on the transparent substrate 1, and a transparent colored resin layer 4 containing a coloring agent, formed on the mesh layer 3.

In addition, a transparent barrier layer 5 is present between the mesh layer 3 and the transparent colored resin layer 4, and by this transparent barrier layer 5, the mesh layer 3 and the transparent colored resin layer 4 are isolated from each other so that these two layers do not come in contact with each other.

An electromagnetic wave shielding filter 10 shown in FIG. 1(B) plainly shows a form that an anticorrosive layer 6 is further formed on either of the two surfaces (faces) of the electrically conductive layer 2 (in the form shown in this figure, only on one surface (face) on the side opposite to the transparent substrate 1 side) contained in the mesh layer 3 shown in FIG. 1(A).

An electromagnetic wave shielding filter 10 shown in FIG. 1(C) plainly shows a form that a blackening layer 7 is further formed on either of the two surfaces (faces) of the electrically conductive layer 2 (in the form shown in this figure, only on one surface (face) on the transparent substrate 1 side) contained in the mesh layer 3 shown in FIG. 1(B).

Further, an electromagnetic wave shielding filter 10 shown in FIG. 1(D) plainly shows a structure that a functional layer 8 is further laminated to the transparent colored resin layer 4 that has been made to function also as an adhesive layer, with the other parts identical to those of the structure shown in FIG. 1(C). The functional layer 8 is, for example, a layer in the form of a sheet, a plate, or a coating film, having any of the functions of various filters such as antireflection (including, in this specification, so-called anti-glaring) filters, infrared absorption filters, and ultraviolet light absorption filters, those of protective films, and those of component parts of displays themselves, such as front substrates.

Furthermore, an electromagnetic wave shielding filter 10 shown in FIG. 1(E) plainly shows a structure that a transparent adhesive layer 9 is present on the entire surface of the transparent substrate 1 including the openings in the mesh layer 3, between the transparent substrate 1 and the mesh layer 3, the other parts being the same as those of the structure shown in FIG. 1(C).

The mesh part 3 may be composed of an electrically conductive layer 2 and a blackening layer 7 that are situated in this order, with the electrically conductive layer 2 on the transparent substrate 1 side (FIG. 3(A)). The mesh part 3 may also be composed of an electrically conductive layer 2, a blackening layer 7, and an anticorrosive layer 6 that are situated in the order stated, with the electrically conductive layer 2 on the transparent substrate 1 side (FIG. 3(B)). The mesh part 3 may also be composed of an anticorrosive layer 6, a blackening layer 7, an electrically conductive layer 2, a blackening layer 7, and an anticorrosive layer 6 that are situated in the order stated, with the firstly mentioned anticorrosive layer 6 on the transparent substrate 1 side (FIG. 3(C)).

Figure 6:
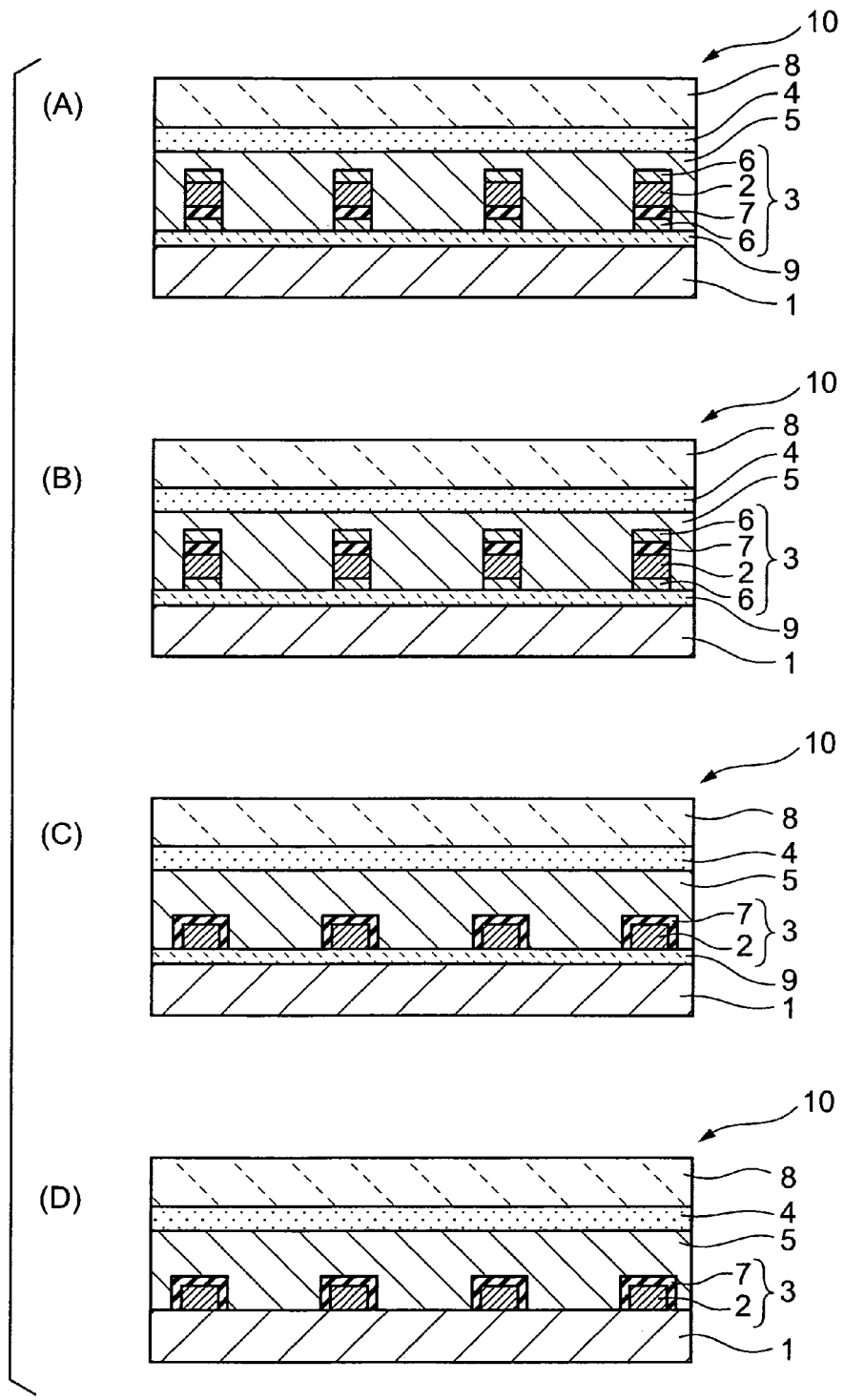
FIGS. 6(A) to 6(D) are sectional views showing the lamination of the various electromagnetic wave shielding filters produced.

Further, the mesh part 3 may be composed of an anticorrosive layer 6, a blackening layer 7, an electrically conductive layer 2, and an anticorrosive layer 6 that are situated in this order, with the firstly mentioned anticorrosive layer 6 on the transparent substrate 1 side (FIG. 6(A)).

Furthermore, the mesh part 3 may be composed of an anticorrosive layer 6, an electrically conductive layer 2, a blackening layer 7, and an anticorrosive layer 6 that are situated in the order stated, with the firstly mentioned anticorrosive layer 6 on the transparent substrate 1 side (FIG. 6(B)).

Moreover, the mesh part 3 may be composed of an electrically conductive layer 2, and a blackening layer 7 that covers a face of the electrically conductive layer 2 on the side opposite to the transparent substrate 1 side and side faces of each opening (FIGS. 6(C) and 6(D)).

SUMMARY

The main feature of the electromagnetic wave shielding filter according to the present invention is its structure, that is, the electromagnetic wave shielding filter of the invention comprises the transparent colored resin layer containing a coloring agent, and further comprises, between the transparent colored resin layer and the mesh layer, the transparent barrier layer for preventing the two layers from coming into direct contact. Although any method can be employed to form the mesh layer on the transparent substrate, one of the typical methods is that, after laminating metal foil and a transparent substrate with a transparent adhesive layer, the metal foil is etched to make openings in it for forming a mesh. Preferably, a pressure-sensitive adhesive or the like is used to form the above-described transparent colored resin layer so that the layer also serves as an adhesive layer, and to this transparent colored resin layer is integrally laminated a functional layer so that the electromagnetic wave shielding filter performs a function fit for the use to which the electromagnetic wave shielding filter will be put, where the functional layer is selected from the following optical items: coloring filters other than the coloring filter made of the above-described transparent colored resin layer, other functional filters (e.g., antireflection filters, infrared absorption filters, etc.), protective films, and component parts of displays themselves, such as front substrates.

The electromagnetic wave shielding filter of the present invention will be described hereinafter; explanation for the respective constituent layers will be given in due order, beginning from explanation for the transparent substrate 1.

[Transparent Substrate]

The transparent substrate 1 is a layer for reinforcing the mesh layer that is poor in mechanical strength. A material having both mechanical strength and light transmission properties may, therefore, be selected and used for the transparent substrate 1, with due consideration for the use to which the electromagnetic wave shielding filter will be put, also for heat resistance, insulating properties, and so forth. Specific examples of the transparent substrate include resin plates, resin sheets (including resin films, the same shall apply hereinafter), and glass plates.

Examples of transparent resins to be made into resin plates, resin sheets, or the like include polyester resins such as polyethylene terephthalate, polybutylene terephthalate, polyethylene naphthalate, terephthalic acid-isophthalic acid-ethylene glycol copolymers, and terephthalic acid-cyclohexane dimethanol-ethylene glycol copolymers; polyamide resins such as nylon 6; polyolefin resins such as polypropylene and polymethyl pentene; acrylic resins such as polybutyl methacrylate and polymethyl methacrylate; styrene resins such as polystyrene and styrene-acrylonitrile copolymers; cellulose resins such as triacetyl cellulose; imide resins; and polycarbonate resins.

As for the material for the transparent substrate, the above-enumerated resins are used for the transparent substrate either singly or as a resin mixture (including a polymer alloy) of two or more resins. As for the constituent layers of the transparent substrate, the transparent substrate may be composed of either a single layer or a laminate of two or more layers. In the case where a resin sheet is used for the transparent substrate, an oriented sheet such as a monoaxially or biaxially oriented sheet is more preferred from the viewpoint of mechanical strength.

Further, additives such as ultraviolet light absorbers, fillers, plasticizers, and antistatic agents may be incorporated in these resins, as needed.

Glass useful for the glass plates includes silica glass, borosilicate glass, and soda-lime glass, and, more preferably, non-alkali glass that contains no alkali components, has a low rate of thermal expansion and high dimensional stability, and is excellent in working properties in high-temperature heat treatment. A glass substrate can be made to serve also as an electrode substrate that is used for a display front substrate or the like.

The transparent substrate may be made in any thickness fit for the use to which the electromagnetic wave shielding filter will be put. When a transparent resin is used for the transparent substrate, the thickness of the transparent substrate is usually about 12 to 1000 μm, preferably 50 to 700 μm, and more preferably 100 to 500 μm. On the other hand, when a glass plate is used as the transparent substrate, the preferred thickness of the transparent substrate is usually about 1 to 5 mm. In either case, a transparent substrate with a thickness smaller than the above range cannot have sufficiently high mechanical strength, so that it curls, becomes wavy, or is broken; while a transparent substrate with a thickness greater than the above range has excessively high strength, demands higher cost, and makes it difficult to obtain a thinner product.

A sheet (or film), a plate, or the like of any of the above-described inorganic and organic materials may be used as the transparent substrate. Further, the transparent substrate may be made to serve also as a front substrate, one component part of a display body composed of a front substrate, a rear substrate, and others. In the case where the electromagnetic wave shielding filter is used as a front filter that is placed on the front of a front substrate, a transparent substrate in the form of a sheet is superior to that in the form of a plate in thinness and lightness in weight. It is needless to say that resin sheets are superior to glass plates also in unbreakableness.

Further, at least in the initial stage of production, such as the step of forming a mesh layer, it is preferred that the transparent substrate be in the form of a continuous belt-like sheet, because the use of such a substrate makes it possible to continuously produce the electromagnetic wave shielding filter and thus to enhance productivity.

Resin sheets are favorable materials for the transparent substrate for the above-described reasons. Of the resin sheets, sheets of polyester resins such as polyethylene terephthalate and polyethylene naphthalate, and cellulose resin sheets are preferred from the viewpoint of transparency, heat resistance, cost, and so on, and polyethylene terephthalate sheets are most preferred. A transparent substrate having higher transparency is more favorable, and the preferred transparency, as expressed by the transmittance for visible light, is 80% or more.

The surface of the transparent substrate made of a resin sheet or the like may be subjected to conventional adhesion-promoting treatment such as corona discharge treatment, plasma treatment, ozone treatment, flame treatment, primer treatment, preheating treatment, dust-removing treatment, vacuum deposition, or alkali treatment, if necessary.

[Mesh Layer: Electrically Conductive Layer]

The electrically conductive layer 2 is a layer for shielding electromagnetic waves, and even if this layer itself is not transparent, it can show both electromagnetic wave shielding properties and light transmission properties because of the openings made in the layer to form a mesh. The electrically conductive layer 2 is therefore essential for the mesh layer 3 in the form of a mesh. Not only the electrically conductive layer 2 but also an anticorrosive layer 6, a blackening layer 7, and so on that will be described later are considered to be constituent layers of the mesh layer 3 because the latter layers are also maintained in the form of the same mesh as that of the electrically conductive layer, the characteristic form of the mesh layer.

The openings in the mesh may be in any shape and are typically in the shape of a regular square. The shape of the openings include triangles such as equilateral triangle, squares such as regular square, rectangle, rhombus, and trapezoid, polygons such as hexagon, circles, and ovals. The mesh has multiple openings in any of these shapes. Linear line parts having usually a uniform width define the openings, and the openings and the line parts between the openings are uniform in shape and size over the entire surface. As for the specific size, it is preferred from the viewpoint of opening rate and the non-recognizability of the mesh that the width of the lines that define the openings be 25 µm or less, preferably 20 µm or less; and from the viewpoint of light transmission properties, it is preferred that the opening size, defined as [distance between the lines or line pitch]−[line width], be 150 µm or more, preferably 200 µm or more.

The bias angle (the angle between the line parts of the mesh and the peripheral side of the electromagnetic wave shielding filter) may be properly selected with consideration for the pixel pitch and the emission properties of a display so that moiré fringes or the like do not easily occur.

Figure 2:
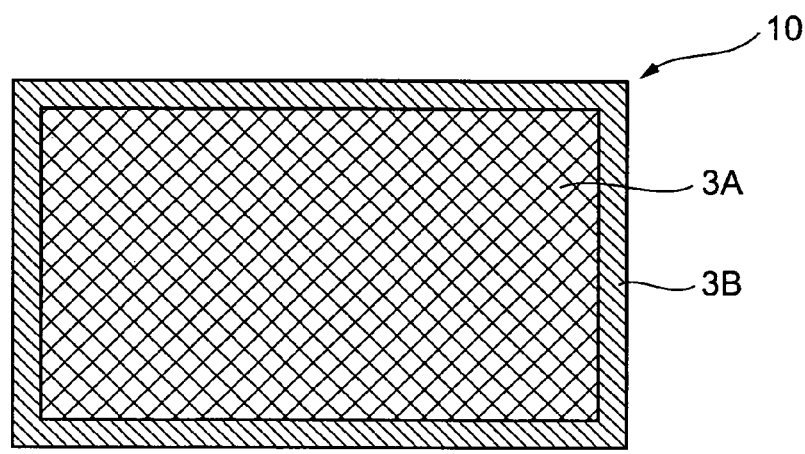
FIG. 2 is a plane view illustrating a frame part surrounding a mesh layer.

Further, it is sufficient to fulfill the purposes that the area having a plurality of the openings (mesh part 3A) be present at least in the area that is required to have light transmission properties (the area that will face to a display screen). It is therefore not necessary that the area having a plurality of the openings cover the entire surface of the electromagnetic wave shielding filter. An example of this case is that, as FIG. 2, a plane view, illustrates, the area not participating in image display, surrounding the rectangular electromagnetic wave shielding filter 10, is made to serve as a frame part 3B in the shape of a frame, having no openings, and the area inside the frame part, which will face to a display screen, is made to serve as a mesh part 3A having a plurality of the openings. The frame part 3B can be used for grounding. The frame part 3B is not needed to be present on the entire peripheral area of the electromagnetic wave shielding filter, but may be present, for example, only on one side of the electromagnetic wave shielding filter. It is preferred that the frame part be exposed either partly or entirely for easy grounding. In order to entirely or partly expose the frame part, the barrier layer, the transparent colored resin layer, and so on are formed to cover the mesh part 3A only or the mesh part 3A plus a part of the frame part 3B so that the frame part 3B has a portion remaining exposed.

The main feature of the present invention is its structure that the mesh layer and the transparent colored resin layer are isolated from each other. Although the electrically conductive layer is typically made of etched metal foil, a mesh layer made from a material other than metal foil also functions as a barrier. In the present invention, therefore, any material and method can be used to form the electrically conductive layer, and it is herein possible to employ any of a variety of electrically conductive layers for use in conventional electromagnetic wave shielding filters having light transmission properties. For example, the electrically conductive layer may be one originally formed into a mesh on a transparent substrate by printing or plating, or one originally formed on the entire surface of a transparent substrate by plating.

In the case where the electrically conductive layer in the form of a mesh is made by etching, a metal layer that has been laminated to a transparent substrate is patterned by etching to make openings in the metal layer, thereby making the metal layer into a mesh. To laminate the metal layer to the transparent substrate, metal foil prepared as the metal layer is laminated to the transparent substrate by an adhesive. Alternatively, without using an adhesive, a metal layer may be formed on a transparent substrate by one of or two or more of physical or chemical methods such as vacuum deposition, sputtering, and plating. To form the electrically conductive layer by etching, metal foil alone that is not yet laminated to a transparent substrate may be etched for patterning to make the metal foil into a mesh. This electrically conductive layer in the form of a mesh is then laminated to a transparent substrate by an adhesive or the like. Of these electrically conductive layers, an electrically conductive layer obtained by firstly laminating metal foil to a transparent substrate by an adhesive and then etching the metal foil into a mesh is desirable. This is because it is easy to handle such an electrically conductive mesh layer whose mechanical strength is low, and also because the productivity of such an electrically conductive layer is high.

Although any material can be used for the electrically conductive layer as long as it has electrical conductivity good enough to exhibit electromagnetic wave shielding properties, a metal layer is generally preferred because of its high electrical conductivity, and such a method as vacuum deposition, plating, or metal foil laminating can be employed to form a metal layer, as described above. Examples of materials useful for the metal layer or foil include gold, silver, copper, iron, nickel, and chromium. The metal for the metal layer may also be an alloy, and the metal layer may be composed of either a single layer or multiple layers. Low-carbon steels such as low-carbon rimmed steels and low-carbon aluminum killed steels, Ni—Fe alloys, and invar alloys are herein preferred as iron materials. In the case where the metal is copper, copper or a copper alloy is used. Although both rolled copper foil and electrolytic copper foil can be used as the copper foil, electrolytic copper foil is preferred from the viewpoint of thinness, uniformity in thickness, adhesion to the blackening layer, and so forth.

The thickness of the electrically conductive layer made of a metal layer is approximately from 1 to 100 µm, and preferably from 5 to 20 µm. An electrically conductive layer with a thickness of less than the above range has increased electrical resistance, so that it cannot satisfactorily show electromagnetic wave shielding properties. On the other hand, an electrically conductive layer with a thickness of more than the above range cannot be made into the desired fine mesh. Consequently, the mesh has a decreased opening rate, which leads to deterioration of light transmission properties, and, a display, disturbed by the side faces of the openings in the mesh, has a decreased viewing angle.

Further, in the case where the electrically conductive layer is made from a metal, especially from a transition metal such as copper or iron, the reaction of the coloring agent contained in the transparent colored resin layer with the metal of the electrically conductive layer, or the catalytic action of the metal, tends to cause color deterioration of the coloring agent, depending on the combination of the coloring agent and the metal. Therefore, in such a case, the transparent barrier layer of the present invention is particularly effective in preventing color deterioration of the coloring agent.

It is preferred that the metal layer to be made into the electrically conductive layer has a roughened surface so that it shows increased adhesion to the adjacent layer such as the transparent adhesive layer. For example, in the case where copper foil is used as the metal layer, the surface of the copper foil is roughened simultaneously with the formation of a blackening layer on the copper foil by blackening treatment (the blackening layer has a roughened surface). The roughness of the roughened surface is preferably about 0.1 to 10 µm, more preferably 1.5 µm or less, most preferably 0.5 to 1.5 µm, as expressed by the Rz value, a mean value of 10 measurements obtained in accordance with JIS-B0601 (1994 version). When the metal layer has such surface roughness that the Rz value is lower than the above range, the effect of surface roughening cannot be fully obtained. On the other hand, when the metal layer has such surface roughness that the Rz value is greater than the above range, an adhesive, a resist, or the like tends to cause incorporation of air bubbles when it is applied to the metal layer.

In the case where the anticorrosive layer contains a metal, especially a transition metal (chromium, zinc, etc.), the reaction of this metal with the coloring agent contained in the transparent colored resin layer, or the catalytic action of the metal, tends to cause color deterioration of the coloring agent, depending on the combination of the metal and the coloring agent. Therefore, when such an anticorrosive layer is present, the effect of the transparent barrier layer of the present invention can be particularly anticipated.

[Mesh Layer: Anticorrosive Layer]

The mesh layer 3 may be composed only of the electrically conductive layer 2. However, since an electrically conductive layer made of a metal layer can corrode in the course of production, or while it is handled, and deteriorate to have impaired electromagnetic wave shielding properties, it is preferable to cover the surface of the electrically conductive layer with an anticorrosive layer 6 if it is necessary to prevent corrosion of the electrically conductive layer. Further, when the blackening layer, which will be described later, is easy to rust, it is preferable to cover both the electrically conductive layer and the blackening layer with an anticorrosive layer. One or more necessary faces selected from the front surface, the back surface, and the side faces of the electrically conductive layer, with consideration for production cost, and so on, may be covered with the anticorrosive layer. Therefore, referring to FIG. 3 and some other figures, the anticorrosive layer may be formed to cover the front surface only (see FIG. 3(B), for example), the back surface only, both the front surface and the back surface (see FIG. 3(C), for example), the side faces (on both sides or one side) only, the front surface and the both side faces, the back surface and the both side faces, or the front surface and the back surface and the both side faces.

In this specification, the "front surface" means a face, on the side opposite to the transparent substrate side, of a layer under discussion (the face on the upper side in the figures; in the case of the transparent substrate, its face on the upper side in the figures); the "back surface" means a face, on the transparent substrate side, of a particular layer under discussion (the face on the lower side in the figures; in the case of the transparent substrate, its face on the lower side in the figures); and the "side face" means a face connecting the front surface and the back surface (the face stretching vertically in the figures) (this description applies equally to the electrically conductive layer, the functional layer, and the other layers). When the electromagnetic wave shielding filter is mounted on a display or the like, the filter face to be directed to the observer side is not always its front surface as herein defined, but can be its back surface.

Any material selected from inorganic materials such as metals, organic materials such as resins, combination of these materials, and so forth can be used for the anticorrosive layer as long as it is less apt to rust than the electrically conductive layer on which the anticorrosive layer will be formed. In some cases, by covering also the blackening layer with the anticorrosive layer, it is possible to prevent falling or deformation of particles with which the blackening layer is formed and also to enhance the blackness of the blackening layer. Therefore, when metal foil is used to make the mesh layer, and a blackening layer is formed beforehand on the metal foil present on the transparent substrate by blackening treatment, it is preferable to form, before laminating the transparent substrate and the metal foil, the anticorrosive layer on the blackening layer for preventing falling and deterioration of the blackening layer.

The anticorrosive layer 6 may be any of conventional ones including layers of metals such as chromium, zinc, nickel, tin, and copper, layers of alloys of these metals, and layers of metallic compounds of metallic oxides. A conventional plating process or the like may be used to form these layers. An example of the anticorrosive layer favorable from the viewpoint of anticorrosion, adhesion, etc. is a chromium compound layer obtained by conducting zinc plating, followed by chromate treatment. The anticorrosive layer made of such a chromium compound layer is excellent also in adhesion to a blackening layer made from copper-cobalt alloy particles and to a transparent adhesive layer (especially, a two-pack curable urethane resin adhesive); these two layers will be described later.

In the case where chromium is used to form the anticorrosive layer, chromate (chromic acid salt) treatment or the like may be carried out. The chromate treatment is conducted by bringing a surface to be treated into contact with a chromate treatment liquid. This contact can be made by such a coating method as roll, curtain, squeeze or flow coating (by which one side is brought into contact with a chromate treatment liquid), and it is also possible to bring both sides into contact with a chromate treatment liquid by electrostatic spray or dip coating. The surface that has been brought into contact with the chromate treatment liquid is dried without washing it with water. For the chromate treatment liquid, an aqueous solution containing chromic acid is usually used, and, specifically, such treatment liquids as "Alsurf (trademark) 1000" (manufactured by Nippon Paint Co., Ltd., Japan), and "PM-284" (manufactured by Nippon Parkerizing Co., Ltd., Japan) are useful.

To conduct zinc plating prior to the chromate treatment is preferred from the viewpoint of adhesion and anticorrosion. Further, a silicon compound such as a silane-coupling agent may be incorporated in the anticorrosive layer in order to increase acid resistance that is needed for etching or washing with an acid.

The thickness of the anticorrosive layer is usually about 0.001 to 10 μm, preferably from 0.01 to 1 μm.

In the case where the anticorrosive layer contains a metal, especially a transition metal (nickel, zinc, etc.), the reaction of the metal with the coloring agent contained in the transparent colored resin layer, or the catalytic action of the metal, tends to cause color deterioration of the coloring agent, depending on the combination of the metal and the coloring agent. Therefore, when such an anticorrosive layer is present, the effect of the transparent barrier layer of the present invention can be particularly anticipated.

[Mesh Layer: Blackening Layer]

The blackening layer 7 can improve the contrast of an image displayed on a display in a bright room. Some blackening layers have roughened surfaces and can therefore have increased adhesion to the adjacent layer, as mentioned before. In order to improve the contrast of an image displayed on a display, it is preferable to form the blackening layer on all of the faces of the mesh layer (the electrically conductive layer, or the electrically conductive layer on which the anticorrosive layer has been formed) that are seen by a viewer. However, an adequate effect can be obtained when the blackening layer is formed at least on one face selected from the front surface, the back surface, and the side faces of the mesh layer. Therefore, the blackening layer may be formed to cover, for example, the front surface only (see FIG. 3(A), for example), the back surface only (see FIG. 1(C), for example), both the front surface and the back surface (see FIG. 3(C), for example), the side faces (on both sides or one side) only, the front surface and the both side faces (see FIGS. 6(C) and 6(D), for example), the back surface and the both side faces, or the front surface and the back surface and the both side faces, although the selection of faces to be covered depends on the position of the electromagnetic wave shielding filter in relation to a display.

In any case, any layer selected from conventional blackening layers may be used as long as it assumes a dark color such as black and meets the required basic physical properties such as adhesive properties.

Therefore, inorganic materials such as metals, organic materials such as black-colored resins, and so forth can be used for the blackening layer. For example, when an inorganic material is used, a metallic layer of a metal or alloy, or that of a metallic compound of a metallic oxide or sulfide is formed as the blackening layer. To form a metallic layer, a proper method selected from a variety of conventional methods useful for blackening treatment can be employed. Of these, blackening treatment by plating is preferred from the viewpoint of adhesion, uniformity, easiness, and so on. Materials herein useful for plating include metals such as copper, cobalt, nickel, zinc, molybdenum, tin, and chromium, and metallic compounds. These metals are superior to cadmium or the like in adhesion, blackness, and so forth.

A plating process that is favorably employed to conduct blackening treatment to form a blackening layer on an electrically conductive layer made from copper such as copper foil is cathodic electrodeposition plating in which the copper-made electrically conductive layer is subjected to cathodic electrolysis in an electrolyte such as sulfuric acid, copper sulfate, or cobalt sulfate, thereby depositing cationic particles on the copper foil. When this process is employed, the deposited cationic particles blacken the electrically conductive layer, and, at the same time, roughen the surface of this layer. Copper or copper alloy particles can be used herein as the cationic particles. Copper-cobalt alloy particles are preferred for the copper alloy particles, and their mean particle diameter is preferably from 0.1 to 1 μm. A blackening layer made of a copper-cobalt alloy particle layer can be obtained by depositing copper-cobalt alloy particles. Cathodic electrodeposition is convenient to deposit uniformly sized particles with a mean particle diameter of 0.1 to 1 μm. When the mean particle diameter is greater than the above range, the deposited particles have decreased denseness and blackness and are poor in uniformity, and the falling of the particles (the falling of the powdery coating) easily occurs. Also when the mean particle diameter is smaller than the above-described range, the deposited particles have decreased blackness. If treated at high current density in the cathodic electrodeposition, the surface becomes cathodic and generates reducing hydrogen to get activated, so that significantly improved adhesion can be obtained between the copper face and the cationic particles.

Further, black chromium, black nickel, nickel alloys, and the like are also preferred for the blackening layer, and the nickel alloys include nickel-zinc alloys, nickel-tin alloys, and nickel-tin-copper alloys. In particular, nickel alloys are excellent in blackness and electrical conductivity, and, moreover, can form anticorrosive blackening layers (serving as both the blackening layer and the anticorrosive layer). Therefore, if a nickel alloy is used to form the blackening layer, the anticorrosive layer may be omitted. In addition, since the particles forming the blackening layer are usually needlelike, they are readily deformed by external forces and undergo a change in appearance. However, nickel alloy particles are not so easily deformed, so that the blackening layer made from nickel alloy particles is advantageous in that it scarcely undergoes a change in appearance in the subsequent processing steps. A conventional electroplating or electroless plating process may be used to deposit a nickel alloy to form the blackening layer. The deposition of a nickel alloy may be effected after conducting nickel plating.

When the blackening layer is made from a metal such as a metallic compound or an alloy, especially when it is made from a transition metal (nickel, etc.), the reaction between the metal in the blackening layer and the coloring agent in the transparent colored resin layer, or the catalytic action of the metal, tends to cause color deterioration of the coloring agent, depending on the combination of the metal and the coloring agent. Therefore, when a blackening layer containing a metal is present, the effect of the transparent barrier layer of the present invention can be particularly anticipated.

[Transparent Adhesive Layer]

The transparent adhesive layer 9 is for laminating and fixing the mesh layer 3 to the transparent substrate 1. This layer can be omitted, depending on the manner in which the mesh layer is formed. An example of the case where the transparent adhesive layer 9 is needed is that metal foil to be made into the electrically conductive layer in the mesh layer is laminated and fixed to the transparent substrate by an adhesive. In this case, it is necessary to use a transparent adhesive for laminating the metal foil to the transparent substrate so that the adhesive that is seen through the openings in the electrically conductive layer does not impair the light transmission properties. In particular, in the case where, after laminating metal foil to a transparent substrate, the metal foil is etched to make openings in it to form a mesh, the adhesive is required to have transparency because it is exposed at each opening. For this reason, it is preferred that the electrically conductive layer 2 made of the metal foil and the transparent substrate be laminated with a transparent adhesive layer made from a transparent adhesive.

Any proper laminating method selected from conventional ones may be used to laminate the metal foil and the transparent substrate. Of the conventional laminating methods, dry laminating is a common method when a resin sheet, a typical material, is used for the transparent substrate.

Any proper transparent adhesive selected from conventional ones can be used as the transparent adhesive to form the transparent adhesive layer. Examples of transparent adhesives herein useful include urethane adhesives, acrylic adhesives, epoxy adhesives, and rubber adhesives. Of these, urethane adhesives are preferred from the viewpoint of adhesive strength, and so on. Such urethane adhesives include two-pack curable urethane resin adhesives, which use two-pack curable urethane resins containing various hydroxyl-group-containing compounds and various polyisocyanate compounds.

Examples of hydroxyl-group-containing compounds include polyols such as acrylic polyols, polyester polyols, polyether polyols, and polycarbonate polyols. Examples of polyisocyanate compounds include aromatic isocyanates such as tolylene diisocyanate, xylylene diisocyanate, naphthalene diisocyanate, and diphenylmethane diisocyanate, aliphatic or alicyclic isocyanates such as hexamethylene diisocyanate, hydrogen-added tolylene diisocyanate, and isophorone diisocyanate, and polymers or addition products of these isocyanates.

In the case where the transparent adhesive layer is present, especially when a urethane adhesive is used, the color of the coloring agent tends to change depending upon the combination of the adhesive and the coloring agent. The reason for this is possibly as follows: a metallic ion contained in an etchant that is used for etching the electrically conductive layer to make it into a mesh, such as ferric iron ion contained in an aqueous ferric chloride solution, penetrates those portions of the transparent adhesive layer that are exposed at the openings, and causes color deterioration of the coloring agent. Especially when a urethane adhesive is used, color deterioration of the coloring agent is caused by the reaction of urethane bond with the coloring agent. Therefore, when the transparent adhesive layer is present, especially when a urethane adhesive is used, the effect of the transparent barrier layer of the present invention can be particularly anticipated.

The transparent adhesive layer may be formed in the following manner: a transparent adhesive is applied to either of or both of metal foil (preferably, metal foil before being made into a mesh) and a transparent substrate by a conventional method of application, and the two members are then laminated to each other. The method of application includes coating methods such as roll, comma, or gravure coating, and printing methods such as screen or gravure printing. Although the transparent adhesive layer may be formed in any thickness (when dried), the thickness is usually from 0.1 to 20 µm; and a thickness of 1 to 10 µm is more preferred from the viewpoint of adhesive strength, cost, working properties, and so forth.

[Transparent Colored Resin Layer]

The transparent colored resin layer 4 is a layer for making the electromagnetic wave shielding filter also function as an optical filter, and it is a resin layer made from a transparent resin matrix in which a coloring agent has been incorporated. To form the transparent colored resin layer, a resin composition prepared by adding the desired coloring agent to a binder consisting of a transparent resin or the like may be applied by a conventional method of forming a layer, such as coating. To the binder, a variety of additives useful for coating liquids or ink, such as solvents and dispersion stabilizers, may be optionally added, and, moreover, photostabilizers such as ultraviolet light absorbers may also be added, if necessary. Further, it is also preferred that the transparent colored resin layer be made to serve also as an adhesive layer so that it can be used to integrate a functional layer, such as another optical filter or an optical article, into the electromagnetic wave shielding filter.

By the word "colored" is herein meant that a layer is made to absorb light with wavelengths at least in a part of the wave range covering from the ultraviolet region to the visible light range and to the infrared region. For example, a resin layer in which a coloring agent that absorbs light in the visible light range has been incorporated appears literally pigmented (to a color including achromatic color such as dark gray). However, when a coloring agent that absorbs light in the ultraviolet or infrared region only and absorbs no or substantially no light in the visible light range is incorporated in a resin layer, the human eyes cannot recognize the resin layer as being colored. Even such a resin layer is also referred to as a "colored"-resin layer in this specification.

A coloring agent fit for the purpose of the electromagnetic wave shielding filter serving as an optical filter is used as the above-described coloring agent. Therefore, when the purpose of the optical filter is to improve color reproducibility by suppressing the emission of neon from a PDP, it is proper to use a coloring agent that greatly absorbs light of approximately 590 nm in the neon emission spectrum. For preventing malfunction of infrared ray equipment, it is proper to use a coloring agent that has absorption in the infrared or near infrared region. When such a coloring agent has absorption also in the visible light range, but the absorption is non-uniform, the layer is unfavorably colored, and the white balance of an image displayed cannot be maintained. For avoiding this phenomenon, it is proper to co-use a coloring agent that has absorption in the other part of the visible light range, thereby making the light absorption neutral (achromatic) over the entire visible light range.

Although conventional inorganic or organic coloring agents can be used for the above-described coloring agent, coloring agents that scarcely increase haze are preferred from the viewpoint of light transmission properties. From this point of view, dyes are generally more favorable for the coloring agent than pigments. However, some pigments are excellent in light transmission properties (light transmittance), and, moreover, they are generally superior to dyes in weathering resistance, so that a properly selected pigment is herein useful. Further, it is a matter of course that two or more types of coloring agents, including pigments and dyes, may be used in combination. Furthermore, the transparent colored resin layer may be composed of two or more layers, and, in the case of a multi-layered transparent colored resin layer, the type of the coloring agent, the amount of the coloring agent to be co-used, the amount of the coloring agent(s) to be incorporated, and so on may be varied from layer to layer. The amount of the coloring agent(s) may be properly decided by the required properties, the thickness of the transparent colored resin layer, and so forth, and it is from 0.001 to 50% by weight of the total weight of the resin material contained in the transparent colored resin layer, for example.

Of the above-described coloring agents, those coloring agents that absorb infrared rays, especially near infrared rays (near infrared absorbers, NIR absorbers), specifically include phthalocyanine dyes and naphthalocyanine dyes (see Japanese Laid-Open Patent Publications No. 120186/1996 and No. 279125/1997, etc.), anthraquinone dyes (see Japanese Laid-Open Patent Publications No. 43605/1985, No. 115958/1986, No. 291651/1986, No. 132963/1987, and No. 172458/1989, etc.), amminium salt dyes (see Japanese Laid-Open Patent Publications No. 236131/1985 and No. 174403/1992, etc.), dithiol metal complex pigments (see Japanese Laid-Open Patent Publications No. 21458/1982, No. 32003/1986, and No. 187302/1987, Japanese Patent Publication No. 32003/1986, and Japanese Laid-Open Patent Publication No. 32003/1986, etc.), and diimmonium salt dyes (see Japanese Laid-Open Patent Publications No. 178808/1993, No. 295967/1993, and No. 310031/1997, etc.).

A coloring agent that absorbs light produced by neon emission (neon light absorber, Ne light absorber) is used to shield light with wavelengths of approximately 590 nm produced by neon emission from a PDP, in order to compensate for the color tone of an image to improve color reproducibility. Such a coloring agent is one that has the maximum absorption in the vicinity of 590 nm, and typical examples of coloring agents of this type include polymethine coloring agents (dyes) (see Japanese Laid-Open Patent Publication No. 53799/2004), cyanine dyes, xanthene dyes, azomethine dyes, and porphine dyes.

A coloring agent selected from a variety of conventional coloring agents including pigments and dyes, such as azo pigments, phthalocyanine dyes, and anthraquinone dyes, may be used as the coloring agent that absorbs light in the visible light range.

Thus, the coloring agent is properly used depending on the purpose for which it is employed, and coloring agents that serve as near infrared absorbers or neon light absorbers are of great importance when the electromagnetic wave shielding filter is used for a display, and come under the group of coloring agents for which the present invention is effective.

The causes of the phenomenon that the transparent colored resin layer undergoes a change in color with time when this layer is in direct contact with the mesh layer are not yet clear. It is, however, possible to avoid this phenomenon by placing a resin layer between the two layers, so that one of the causes is probably that the metal or metallic ion (the metallic ion that has been present in an etchant and has penetrated in the electrically conductive layer, the blackening layer, the anti-corrosive layer, or the transparent adhesive layer), a non-resin component, acts on and affects the absorption spectrum of the coloring agent contained in the transparent colored resin layer. Further, when the coloring agent is a compound having a counter ion, the metal or metallic ion is considered to have a greater influence on the counter ion.

Another possible cause is assumed to be as follows: when the transparent adhesive layer is made from a urethane adhesive, urethane bond in the adhesive reacts with a certain type of coloring agents, such as diimmonium dyes and phthalocyanine dyes, to cause a change in the transmission spectrum of the coloring agent.

For the transparent colored resin layer can be used any transparent resin as long as it is properly selected from conventional ones with consideration for, for example, the adhesion to the adjacent layers such as the transparent barrier layer and the functional layer. For example, thermoplastic resins, thermosetting resins, and ionizing-radiation-curing resins are useful for the transparent colored resin layer. Examples of thermoplastic resins include acrylic resins, polyester resins, thermoplastic urethane resins, and vinyl acetate resins; examples of thermosetting resins include urethane resins, epoxy resins, and curable acrylic resins; and examples of ionizing-radiation-curing resins include acrylate resins that cure in ultraviolet light or electron beams (such as those resins that will be enumerated later as materials useful for the transparent barrier layer).

It is also favorable to make the transparent colored resin layer also serve as an adhesive layer so that it is convenient to further integrally laminate a functional layer, such as an optical filter, to it. By integrally laminating a functional layer to the transparent colored resin layer serving also as an adhesive layer, it is possible to make the number of the constituent layers smaller (no additional adhesive layer being needed), which leads to decrease in cost and haze, improvement in light transmission properties, and reduction in weight and thickness. When the transparent colored resin layer is made to serve also as an adhesive layer useful in laminating the functional layer, not only the above-described resins but also resins that become pressure-sensitive adhesives can be used to form the transparent colored resin layer. Namely, the adhesiveness of the adhesive layer of the present invention encompasses tackiness. The "pressure-sensitive adhesive" herein means an agent that enables a layer to adhere to another object only with the tackiness of the surface of the layer when a proper pressure (such a pressure as is exerted lightly by the hand) is simply exerted to the layer. In order for a pressure-sensitive adhesive to reveal its tackiness, physical actions or energy such as heating, moistening, or irradiation, or chemical reactions such as polymerization reaction are not needed. A pressure-sensitive adhesive is not fully solidified even after a diluent has been evaporated, and remains in a semi-fluid state. Therefore, conventional adhesives, as well as conventional pressure-sensitive adhesives, can be used as the resin for the transparent colored resin layer. Examples of resins that become pressure-sensitive adhesives include acrylic resins, silicone resins, and rubber resins.

In the case where the binder (resin component) of the transparent colored resin layer is a pressure-sensitive adhesive, the binder resin remains in a semi-fluid state even after a functional layer has been laminated, so that the coloring agent added to the binder resin moves with time in the transparent colored resin layer. This tendency is significant especially when the coloring agent is an organic material having a relatively low molecular weight. In this case, therefore, a probability that the coloring agent will react with the mesh layer or the transparent adhesive layer becomes high, and color deterioration of the coloring agent thus easily occurs. For this reason, when the binder of the transparent colored resin layer is a pressure-sensitive adhesive, the transparent barrier layer of the present invention acts effectively.

In the case where the transparent colored resin layer is not made to serve also as an adhesive layer useful in laminating a functional layer, it can be formed, by a conventional method of forming a layer, such as coating, on the mesh-layer-side surface of the mesh-layer-laminated transparent substrate. On the other hand, when the transparent colored resin layer is made to serve also as an adhesive layer useful in laminating a functional layer, the following method may also be employed: a transparent colored resin layer is formed, by a conventional method of forming a layer, such as coating, on the surface of a functional layer preformed as a substantial being such as a sheet, not yet laminated to a mesh layer; the functional layer to which the transparent colored resin layer has been laminated is laminated integrally to a mesh layer, with the transparent colored resin layer facing to the mesh layer, by exerting a pressure on the mesh layer with a pressure roll or the like. A specific example of this method is the following method of laminating (forming) layers: a pressure-sensitive adhesive for forming the transparent colored resin layer is applied to a resin sheet useful for an optical filter such as an antireflection filter, or to a resin sheet useful for surface protection, thereby obtaining a pressure-sensitive-adhesive-coated resin sheet; this resin sheet is laminated, by making use of the pressure-sensitive adhesive, to a mesh-laminated sheet obtained by forming a mesh layer on a transparent substrate. A conventional separator or the like may be optionally placed, for protection, on the tacky face of the pressure-sensitive-adhesive-coated resin sheet. For example, a resin sheet such as a biaxially oriented polyethylene terephthalate film whose surface has been treated with silicone or the like to be releasable is useful for the separator.

To form beforehand the transparent colored resin layer on the functional layer is also convenient to laminate the transparent colored resin layer to the mesh layer in such a manner that the mesh layer includes a frame part useful for grounding, and that the frame part is not covered with the transparent colored resin layer to remain exposed. The following manner, for example, can make it easy to integrally laminate the transparent colored resin layer and the functional layer to the mesh layer, with the frame part of the mesh layer exposed: a transparent colored resin layer is continuously formed on a continuous belt-like sheet for the functional layer; this continuous belt-like sheet is cut into sheets, and each sheet is properly positioned on and laminated to a mesh-laminated sheet obtained by laminating a mesh layer to a transparent substrate. In this case, the mesh-laminated sheet may be in the form of either a continuous belt-like sheet or a cut sheet.

A proper coating method, such as roll, comma, or gravure coating may be employed to form the transparent colored resin layer. Alternatively, there may also be employed a printing method, such as screen or gravure printing, by which a transparent colored resin layer in any non-solid pattern can be formed with ease.

Although the thickness of the transparent colored resin layer may be properly decided with consideration for the amount of the coloring agent to be added, the desired intensity of light absorption, the adhesive properties of the transparent colored resin layer that also serves as an adhesive or pressure-sensitive adhesive layer, uniformity in thickness, easiness of production, and so forth, it is approximately 0.1 to 30 μm, for example. The uniformity in thickness brings about uniformity in coloring. Even if the transparent barrier layer has a roughened surface, the purpose is fulfilled as long as the mean thickness of the transparent colored resin layer on the mesh part of the mesh layer is uniformly maintained over the entire surface of the electromagnetic wave shielding filter, and the thickness of the transparent colored resin layer at the openings and that at the non-opening portions may be different from each other.

[Transparent Barrier Layer]

The transparent barrier layer 5, existing between the transparent colored resin layer 4 and the mesh layer 3, is a layer for preventing the two layers from coming into contact. Any layer may be used for the transparent barrier layer as long as it can prevent the transparent colored resin layer and the mesh layer from coming into direct contact with each other. However, a layer formed by coating or the like is more favorable than a layer formed by a physical film-forming method such as vacuum deposition because the former layer can be obtained more easily and is also advantageous from the viewpoint of cost. In this regard, a transparent resin layer made from a transparent resin is suitable for the transparent barrier layer. Any of various methods of application, such as a coating (post polymerization) method using a solution, a dispersion, or a resinous material (a composition containing a monomer, a prepolymer, etc.) liquid, or extrusion coating using a melted resin, may be employed to form a transparent resin layer useful for the transparent barrier layer. Examples of coating methods herein useful include roll coating, comma coating, gravure coating, curtain coating, squeeze coating, flow coating, electrostatic spraying, and dip coating. It is also possible to employ a printing method, such as screen or gravure printing, by which a transparent resin layer can be formed in any non-solid pattern.

The reason why the barrier layer is made transparent is as follows: when the barrier layer is formed by coating or the like on the mesh layer present on the transparent substrate, the openings in the mesh layer are also covered with the barrier layer, unless a special measure is taken; the barrier layer should, therefore, be made transparent so that light transmission properties do not deteriorate due to the (transparent) barrier layer formed in the openings. For this reason, if the barrier layer can be formed or has been formed only on the portions excluding the openings, it is not always needed to be transparent and may be simply a "barrier layer". Practically, however, since it is easier to form the barrier layer also in the openings, the barrier layer is formed as a transparent layer. Namely, the transparent barrier layer is a layer that may be formed also in the openings in the mesh layer. Further, in the embodiment that the transparent adhesive layer is present on those portions of the transparent substrate that correspond to the openings in the mesh layer, even if the transparent adhesive layer contains substances such as impurities that undesirably contribute to discoloration, the transparent barrier layer effectively prevents discoloration of the transparent colored resin layer with time that is affected by such a transparent adhesive layer.

Any resin can be used as the above-described transparent resin as long as it is transparent and can prevent the coloring agent from migrating toward and coming into contact with the mesh layer and the transparent adhesive layer to cause reaction. In the case where the transparent barrier layer is formed so that it comes into contact with both the mesh layer and the transparent adhesive layer, a proper transparent resin may be selected from conventional ones with consideration for the adhesion to the transparent adhesive layer, and so on. Examples of transparent resins herein useful include thermoplastic resins, thermosetting resins, and ionizing-radiation-curing resins. The thermoplastic resins include acrylic resins, vinyl acetate resins, and thermoplastic urethane resins; and the thermosetting resins include urethane resins, epoxy resins, and curable acrylic resins. It is preferred that these resins be of non-pressure-sensitive adhesive type. Further, it is preferable to select a transparent resin that can form a solid, non-fluid, transparent barrier layer. By using such a transparent resin, it is possible to prevent, with certainty, the coloring agent that is contained in the transparent colored resin layer and that moves in and passes through the transparent barrier layer to be the cause of discoloration, from coming into contact with a constituent layer of the mesh layer (the electrically conductive layer, the blackening layer, or the anticorrosive layer), or with the transparent adhesive layer.

Of these resins, ionizing-radiation-curing resins are preferred because they cure in ionizing radiation into a non-sticky, solid state with greater certainty. Further, ionizing-radiation-curing resins are advantageous also in that, since they can be applied without using any solvent, the solvent-evaporating step can be omitted, which leads to higher productivity. Furthermore, ionizing-radiation-curing resins are preferred also for the following reason: even when a solvent is added to an ionizing-radiation-curing resin, a small amount of the solvent suffices for the purpose; moreover, since an ionizing-radiation-curing resin can be applied by using no or almost no solvent, it is possible to prevent great volume shrinkage that usually occurs when evaporating a solvent for forming a coating film; and depressions that are the reflections of the openings in the mesh layer formed on the transparent substrate are completely filled with the ionizing-radiation-curing resin, which makes it easy to smoothen the surface of the transparent barrier layer. When smoothness is obtained in this manner, the thickness of the transparent colored resin layer that is laminated to the transparent barrier layer is easily made uniform over the entire surface of the mesh layer including the openings and the non-opening portions (line parts). Consequently, uniformity in coloring can be easily attained. In the case where a functional layer, such as another filter or a component part of a display itself, is further laminated to the transparent colored resin layer by an adhesive or the like, the above-described smoothening is also effective in preventing the adhesive or the like from incorporating air bubbles, which occurs when an adherend surface has irregularities.

The ionizing-radiation-curing resins are compositions that cause polymerization or crosslinking to cure when exposed to ionizing radiation that is typically ultraviolet light or an electron beam, and it is herein preferable to use a composition containing a prepolymer (including a so-called oligomer) and/or a monomer. Either a single prepolymer or monomer, or a mixture of two or more prepolymers or monomers is used.

Specifically, the above-described prepolymer or monomer is a compound having, in its molecule, a radically polymerizable unsaturated group such as (meth)acryloyl or (meth)acryloyloxy group, a cationically polymerizable functional group such as epoxy group, or the like. The above-described prepolymer also includes polyene/thiol prepolymers that are combinations of polyenes and polythiols. (Meth)acryloyl group herein means acryloyl group or methacryloyl group. Similarly, (meth)acrylate that will be described hereinafter means acrylate or methacrylate. Acrylate compounds and methacrylate compounds are also collectively referred to simply as acrylate (compounds).

Examples of prepolymers having radically polymerizable unsaturated groups include polyester (meth)acrylate, urethane (meth)acrylate, epoxy (meth)acrylate, melamine (meth)acrylate, and triazine (meth)acrylate. The molecular weight of these prepolymers useful herein is usually about 250 to 100,000.

Examples of monomers having radically polymerizable unsaturated groups include monofunctional monomers such as methyl (meth)acrylate, 2-ethylhexyl (meth)acrylate, phenoxyethyl (meth)acrylate, 2-hydroxyethyl (meth)acrylate, 2-hydroxypropyl (meth)acrylate, 2-hydroxybutyl (meth) acrylate, 2-hydroxy-3-phenoxypropyl (meth)acrylate, carboxypolycaprolactam (meth)acrylate, and (meth)acrylamide.

Examples of polyfunctional monomers include difunctional monomers such as 1,6-hexanediol di(meth)acrylate, neopentyl glycol di(meth)acrylate, ethylene glycol di(meth) acrylate, diethylene glycol di(meth)acrylate, propylene glycol di(meth)acrylate, tripropylene glycol di(meth)acrylate, and pentaerythritol di(meth)acrylate monostearate; trifunctional monomers such as pentaerythritol tri(meth)acrylate, trimethylol propane tri(meth)acrylate, and trimethylol propane ethylene oxide tri(meth)acrylate; and polyfunctional monomers having five or more functional groups, such as pentaerythritol tetra(meth)acrylate, dipentaerythritol tetra(meth)acrylate, dipentaerythritol penta(meth)acrylate, and dipentaerythritol hexa(meth)acrylate.

Examples of prepolymers having cationically polymerizable functional groups include epoxy resin prepolymers such as bisphenol epoxy resin prepolymers and epoxy-novolak resin prepolymers, and vinyl ether resin prepolymers such as aliphatic vinyl ether prepolymers and aromatic vinyl ether prepolymers.

Examples of thiols include polythiols such as trimethylol propane trithioglycolate and pentaerythritol tetrathioglycolate. Examples of polyenes include polyurethanes obtained from diols and diisocyanates, having allyl alcohol added to their each end.

In the case where ultraviolet light or an electron beam is used to cure the above-described ionizing-radiation-curing resin, a photopolymerization initiator is further added to the resin beforehand. Examples of photopolymerization initiators suitable for ionizing-radiation-curing resins having radically polymerizable unsaturated groups include acetophenones, bonezophenones, ketals, anthraquinones, thioxanethones, azo compounds, peroxides, 2,3-dialkyldione compounds, disulfide compounds, thiuram compounds, and fluoroamine compounds. Examples of photopolymerization initiators suitable for prepolymers having cationically polymerizable functional groups include aromatic sulfonium salts, aromatic diazonium salts, aromatic iodonium salts, and metallocene compounds. These photopolymerization initiators are used singly, or two or more of these photopolymerization initiators are used in combination.

Specific examples of the above-described photopolymerization initiators suitable for resins having radically polymerizable unsaturated groups include 1-hydroxy-cyclohexyl-phenyl-ketone [trade name "Irgacure (trademark) 184" manufactured by Ciba Specialty Chemicals K.K., Japan], 2-methyl-1[4-(methylthio)phenyl]-2-morpholino-propan-1-one [trade name "Irgacure (trademark) 907" manufactured by Ciba Specialty Chemicals K.K., Japan], benzyl dimethyl ketone, 1-(4-dodecylphenyl)-2-hydroxy-2-methylpropan-1-one, 2-hydroxy-2-methyl-1-phenylpropan-1-one, 1-(4-isopropylphenyl)-2-hydroxy-2-methylpropan-1-one, and benzophenone.

Electromagnetic waves or charged particles having energy high enough to cause the curing reaction of molecules of ionizing-radiation-curing resin (composition) are used as the ionizing radiation. Although ultraviolet light or an electron beam is usually used as the ionizing radiation, other ionizing radiation such as visible light, X-rays, or ion lines may also be used. Examples of ultraviolet light sources include extra-high-pressure mercury vapor lamps, high-pressure mercury vapor lamps, low-pressure mercury vapor lamps, carbon arc lamps, black light lamps, and metal halide lamps. The wavelength of ultraviolet light for use herein is usually about 190 to 380 nm, and the preferred amount of ultraviolet light to be applied is approximately from 50 to 1000 mJ/cm$^2$. Examples of electron beam sources include a variety of electron beam accelerators such as Cockcroft-Walton accelerator, Van de Graaff accelerator, resonance-transformer-type accelerators, insulation-core-transformer-type accelerators, linear accelerators, dynamitron accelerators, and high-frequency accelerators. The preferred energy of an electron beam to be applied is from 70 to 1000 keV, preferably from 100 to 300 keV, and such an electron beam is usually applied in an amount of approximately 5 to 300 kGy.

Figure 3:
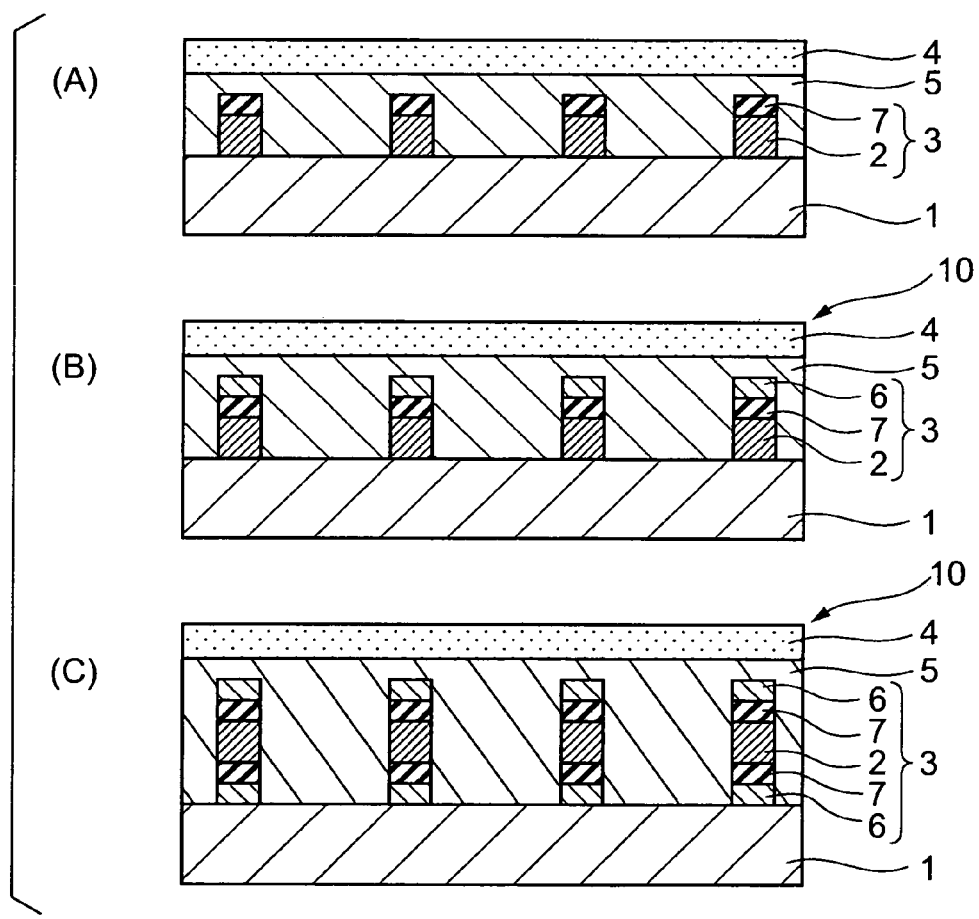
FIGS. 3(A) to 3(C) are sectional views illustrating some other forms of electromagnetic wave shielding filters according to the present invention.
Figure 4:
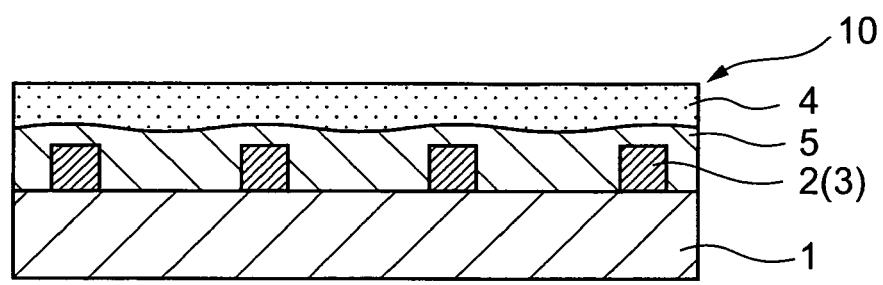
FIG. 4 is a sectional view illustrating another form of an electromagnetic wave shielding filter according to the present invention.
Figure 5:
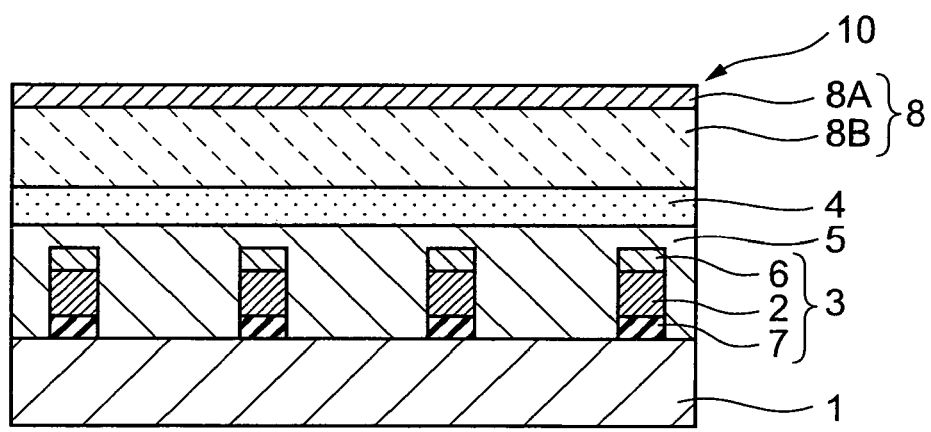
FIG. 5 is a sectional view illustrating a further form of an electromagnetic wave shielding filter according to the present invention.

In FIGS. 1, 3 and 5, the transparent barrier layer 5 is illustrated as having a continuous, flat surface (the boundary front surface on the upper side in each figure) covering the openings and the non-opening portions. However, this surface is not necessarily flat. For example, as conceptually illustrated in FIG. 4 that is a sectional view of an electromagnetic wave shielding filter 10, this front surface of the transparent barrier layer 5 may also be rough. The roughened surface shown in FIG. 4 has depressions at portions that correspond to the openings in the mesh layer. The purpose of the transparent barrier layer is to prevent the mesh layer and the transparent colored resin layer from coming into contact with each other, so that even such a roughened surface as is shown in FIG. 4 can fully meet this purpose. In FIGS. 1, 3 and 5, and some other figures excluding FIG. 4, showing an electromagnetic wave shielding filter of the present invention, the front surface of the transparent barrier layer is depicted as a flat surface. However, these figures are merely conceptual, and this front surface may be either flat (as shown in the figures) or rough. The flat front surface shown in the figures encompasses both a flat front surface and a roughened surface. The flat front surface may be or may not be a mirror surface. The flat front surface is a surface having no irregularities that correspond at least to the distribution, in the direction in which the front surface stretches, of thickness of the mesh layer (such irregularities that those portions of the surface that correspond to the openings form depressions and that the other portions of the surface that correspond to the non-opening portions form protrusions), or a surface that has irregularities of the above type or of other type but has flatness to such a degree that air bubbles are scarcely incorporated when the transparent colored resin layer is formed on this surface by coating or the like, and that distortion of an image displayed on a display or scattering of light that makes the image hazy does not occur. Thus, the flat surface includes a slightly roughened surface that is a reflection of the mesh layer, and, at the same time, is a mirror or matte face, and a surface that has neither small irregularities nor sharp irregularities at portions that correspond to the openings in the mesh layer and is flat but is a matte face having fine irregularities. Namely, a flat surface and a mirror surface are conceptually different from each other; whether a surface is a mirror surface or a non-mirror surface is determined by irregularities that are finer than those by which a surface is determined whether it is flat or non-flat.

To make the front surface of the transparent resin barrier layer matte is advantageous in that a pyramid phenomenon (when an intermediate sheet of an electromagnetic wave shielding filter, which includes a transparent barrier layer formed on a sheet transparent substrate sheet, is wound up into a roll, the air that has entered between layers of the intermediate sheet cannot flee and remains as air bubbles, if the front surface of the intermediate sheet is a mirror surface; these air bubbles are forced into the intermediate sheet by the tension exerted to the sheet when the sheet is wound up, whereby the intermediate sheet has pyramidal minute projections as defects) does not occur, and also in that ply adhesion is improved. When the refractive index is discontinuous at the layer-layer interface due to fine irregularities of the front surface, the front surface may be made into a substantially smooth surface to prevent the interface from causing unwanted reflection of light.

When the surface of the transparent barrier layer is flat, the thickness of this layer varies according to portions, depending on whether the portions correspond to the openings in the mesh layer or to the non-opening portions of the mesh layer, and the thickness of the portions that correspond to the openings in the mesh layer is greater than that of the other portions by the thickness of the mesh layer. However, from the viewpoint of the barrier function of the transparent barrier layer, the thickness of those portions of the transparent barrier layer that correspond to the openings may be the same as that of those portions of the transparent barrier layer that correspond to the non-opening portions (in this case, those portions of the transparent barrier layer that correspond to the openings form depressions). In order for such a transparent barrier layer to have barrier properties, the transparent barrier layer is formed so that its thinnest portion has a thickness of not less than 1 µm, for example. On the hand, since an excessively thick transparent barrier layer brings about excess performance, high cost, and so on, the thickness of the thickest portion of the transparent barrier layer is made not more than 130 µm, for example.

In order for the transparent barrier layer to have, as desired, a smooth surface, a matte surface, a mirror surface, or the like, a shaping sheet may also be used. The shaping sheet is used in the following manner: for example, a coating liquid for forming the transparent barrier layer is applied to the mesh layer laminated to the transparent substrate, and the shaping sheet is placed on the surface of this coating film while the coating film is still in the liquid state, whereby the surface of the coating film is shaped by the shaping sheet face; after the coating film has solidified into such a degree that its shaped surface can remain in its shape, the shaping sheet is removed. Thus, the transparent barrier layer can have a surface in the desired shape. Alternatively, if the coating film causes plastic deformation when heated even after it has solidified, shaping may be conducted by placing the shaping sheet on the coating film even after the coating film has solidified, applying heat and pressure, and then removing the shaping sheet from the coating film.

Any shaping sheet can be herein used as long as it can shape the surface of a coating film, as desired, into a flat surface, for example, and is releasable from the coating film for the transparent barrier layer, and a properly selected material may be used for such a sheet. In the case where an ionizing-radiation-curing resin is used for the transparent barrier layer and ionizing radiation is applied through the shaping sheet to cure this resin, it is proper to select a material that transmits ionizing radiation. When ultraviolet light is used as the ionizing radiation, it is proper to select a material that transmits ultraviolet light. These materials include sheets of a variety of resins.

Examples of resins for the above-described resin sheets include polyester resins such as polyethylene terephthalate, polybutylene terephthalate, polyethylene naphthalate, ethylene glycol-terephthalic acid-isophthalic acid copolymers, and terephthalic acid-cyclohexane dimethanol-ethylene glycol copolymers; polyamide resins such as nylon 6; polyolefin resins such as polypropylene, polymethyl pentene, and cyclic polyolefins; imide resins; and polycarbonate. Of these resins, polyester resins such as polyethylene terephthalate and polyethylene naphthalate, and polyolefin resins such as polypropylene and polynorbornene are preferred from the viewpoint of flatness, strength, release properties, ultraviolet light transmission properties, heat resistance, and cost. Further, from the viewpoint of mechanical strength, oriented sheets such as monoaxially or biaxially oriented sheets are preferred. Specifically, biaxially oriented polyethylene terephthalate sheets are most preferred. The thickness of the resin sheet is approximately from 10 to 1000 µm.

To make the shaping face of the shaping sheet not flat or mirror-like but rough, a resin sheet surface to be used as the shaping face may be embossed, stamped, or chemically etched, or particles may be added to the resin sheet.

When a shaping sheet composed only of a resin sheet has a shaping face poor in release properties, a release layer may be formed on the shaping face by the use of a material having release properties, such as silicone.

By properly controlling the release properties of the shaping face of the shaping sheet (by decreasing releasability if only the release properties are taken into account), it becomes possible to peel off the shaping sheet together with the transparent barrier layer present on the frame part, while leaving the transparent barrier layer on the mesh part of the mesh layer. Thus, the transparent barrier layer that has been once formed on both the frame part and the mesh part can be removed together with the shaping sheet only from the frame part to expose the frame part for easy grounding. In controlling the release properties for this purpose, the wettability of the shaping face, for example, can be used as an index, and it is proper to control the wet tensile strength to 35-45 mN/m (according to JIS K-6768). To properly control the release properties of the shaping face, the shaping face may also be subjected to adhesion-promoting treatment such as corona discharge treatment, plasma treatment, ozone treatment, flame treatment, primer coating treatment, vacuum deposition, or alkali treatment.

[Functional Layer]

The functional layer 8 is a separate layer that is laminated to the transparent colored resin layer serving also as an adhesive layer so that the electromagnetic wave shielding filter additionally performs other functions that the electromagnetic wave shielding filter of the above-described lamination cannot perform, such as surface protection, enhancement of mechanical strength, improvement in optical properties, and the functions of component parts of a display itself. The improvement in optical properties includes the selection of spectra that cannot be fully attained by the function of the transparent colored resin layer, and the other optical functions. Examples of the functional layer for improving optical properties include a variety of filters such as antireflection (including anti-glaring) filters, infrared absorption filters, near infrared absorption filters, neon light absorption filters, and complementary color filters. It is possible to employ a functional layer having any known function that is selected depending on the use to which the electromagnetic wave shielding filter will be put. How the transparent colored resin layer 4 and the functional layer 8 bear their share of the function, improvement in optical properties, or how these two layers mutually complement each other so as to perform this function, is specifically as follows, for example: a coloring agent that absorbs infrared rays is incorporated in the transparent colored resin layer, and a coloring agent that absorbs neon light, in the functional layer. When the transparent colored resin layer also serves as an adhesive layer, the functional layer is a separate layer to be laminated by this adhesive layer, and the purpose of laminating the separate layer is to make the electromagnetic wave shielding filter perform any particular function, or to integrate the separate layer having any particular function into the electromagnetic wave shielding filter (when the separate layer is, for example, a display front substrate, not the former expression but the latter expression is used; another expression is that a display is provided with an electromagnetic wave shielding filter).

Further, the functional layer is prepared as a substantial being, typically in the form of a sheet or plate, and is laminated by the transparent colored resin layer serving also as an adhesive layer, thereby integrating it into the electromagnetic wave shielding filter. The functional layer can thus be laminated without forming an additional adhesive layer, so that it is possible to avoid an increase in the number of production steps that is brought about by an increase in the number of constituent layers, as well as an increase in cost, and so forth. The functional layer may also be a coating film formed by coating, printing, or the like. In this case, the transparent colored resin layer serves also as an adhesive layer that makes up the adhesive properties of the coating film when the coating film itself is poor in adhesive properties.

Such a functional layer may be a conventional substantial being such as an optical filter or a front substrate of a display itself. Alternatively, the functional layer may be formed by the use of a paint or ink useful for forming a coating film that serves as an optical filter. Of these functional layers, a filter in the form of a sheet or plate is typical.

For the above-described optical filter can be used conventional ones, and commercially available filters (sheets, plates) may be herein used. These filters will now be described in more detail.

FIG. 5, a sectional view, illustrates an electromagnetic wave shielding filter 10 having the following structure: The functional layer 8 is a laminate of a functioning layer 8A that performs the main function of the functional layer serving as a hard coat layer, a coloring filter layer, or the like, and a transparent substrate 8B that reinforces and supports the functioning layer: The functional layer 8 is laminated to the surface of the transparent barrier layer 5 through the transparent colored resin layer 4 serving also as an adhesive layer, with the transparent substrate 8B facing to the transparent barrier layer 5, thereby integrating the functional layer 8 into the electromagnetic wave shielding filter 10 so that the functioning layer 8A is the outermost surface layer. Although the functional layer may be a single layer (e.g., a surface protective sheet made of a single-layer resin film), FIG. 5 illustrates the case where the functional layer is composed roughly of two layers, the functioning layer 8A and the transparent substrate 8B that supports the functioning layer 8A. Although each of the functioning layer 8A and the transparent substrate 8B may be composed of a single layer or of multiple layers, this figure illustrates the functional layer as being composed roughly of the functioning layer and the transparent substrate. The functional layer may also be composed of functioning layers and transparent substrates that are laminated alternately. Moreover, the functional layer may also be laminated to the transparent colored resin layer, with the functioning layer side facing to the transparent colored resin layer.

The functioning layer 8A may be of any type. For example, the functional layer 8 is formed as a neon light absorption filter by incorporating a neon light absorber to the functioning layer 8A, while the transparent colored resin layer 4 to which the functional layer 8 will be laminated, with its transparent substrate 8B facing to the transparent colored resin layer 4, is formed, by adding a near infrared absorber, as a near infrared absorption filter layer serving also as an adhesive layer useful in laminating the functional layer 8. Of course, the above construction is merely one specific example of combinations of the function of the functioning layer 8A and that of the transparent colored resin layer 4.

The hard coat layer (HC layer) may be a coating film of an ionizing-radiation-curing resin containing a polyfunctional (meth)acrylate prepolymer such as polyester (meth)acrylate, urethane (meth)acrylate, or epoxy (meth)acrylate, preferably a polyfunctional (meth)acrylate monomer with three or more functionality, such as trimethylol propane tri(meth)acrylate, pentaerythritol tetra(meth)acrylate, or dipentaerythritol hexa(meth)acrylate.

The antireflection layer (abbreviated to AR layer) includes several forms of antireflection layers, such as the dielectric multi-layer interference form in which low-refractive-index layers and high-refractive-index layers are alternately laminated, with a low-refractive-index layer on the outermost side. Either a dry method such as vacuum deposition or sputtering, or a wet method such as coating may be employed to form the above layers. Silicon oxides, magnesium fluoride, fluoroplastics, and the like may be used for the low-refractive-index layers, and titanium oxide, zinc sulfide, zirconium oxide, niobium oxide, and the like, for the high-refractive-index layers.

Another form of the antireflection layer useful herein is one that makes use of the diffusion of light that is caused by fine surface irregularities or by an interface, existing inside the layer, between two phases having different refractive indices (commonly called an anti-glaring layer, which is abbreviated to AG layer). Such an antireflection layer may be a coating film formed by using a resin binder to which inorganic filler such as silica has been added, or a layer having, on its surface, fine irregularities that scatter extraneous light, formed by using a shaping sheet, a shaping plate, or the like. Curable acrylic resins, as well as ionizing-radiation-curing resins useful for the above-described hard coat layer, are favorable for the resin binder because the antireflection layer is required to have surface strength high enough for a surface layer.

Further, to form a near infrared absorption filter, an infrared absorption filter, a neon light cutting filter, a color tone compensation filter, or the like as the functional layer, a mixture of a matrix such as a resin and a coloring agent may be used, where the coloring agent is one of the coloring agents previously mentioned in connection with the transparent colored resin layer, selected depending on how the functional layer and the transparent colored resin layer bear their share of the desired function, or on how these two layers mutually complement each other so as to perform the desired function.

The functional layer may be laminated not only to the transparent colored resin layer by making use of the adhesive properties of the transparent colored resin layer, but also to the back surface of the transparent substrate by a proper adhesive agent.

EXAMPLES

The present invention will now be explained more specifically by way of Examples and Comparative Example.

Example 1

The electromagnetic wave shielding filter 10 shown in FIG. 6(A) was produced in the following manner. Continuous belt-like electrolytic copper foil with a thickness of 10 μm, having on one surface a blackening layer 7 made from copper-cobalt particles, was firstly prepared as the metal foil to be made into the electrically conductive layer 2. A non-colored, transparent, biaxially oriented, polyethylene terephthalate film in the form of a continuous belt with a thickness of 100 μm was prepared as the transparent substrate 1.

After plating with zinc, both surfaces of the above-described copper foil were subjected to conventional chromate treatment by immersing the copper foil in a chromate treatment light, thereby forming anticorrosive layers 6 on the surface and the back surface of the copper foil. Subsequently, this copper foil was dry-laminated to the transparent substrate, with the blackening layer side facing to the transparent substrate, by a urethane adhesive made of a transparent two-pack curable urethane resin consisting of 12 parts by weight of polyester polyurethane polyol with a mean molecular weight of 30,000 and 1 part by weight of xylene diisocyanate prepolymer. This laminate was then aged at 50° C. for 3 days, thereby obtaining a continuous belt-like, copper-foil-laminated sheet having a 7-μm thick transparent adhesive layer 9 between the copper foil (anticorrosive layer) and the transparent substrate.

Thereafter, the copper foil (the electrically conductive layer, the blackening layer, and the anticorrosive layer) contained in the above-described copper-foil-laminated sheet was photolithographically etched. Thus, there was obtained a mesh-laminated sheet containing, on the transparent substrate 1, a mesh layer 3 consisting of the anticorrosive layer 6, the electrically conductive layer 2, and the blackening layer 7.

Specifically, by using the existing production line for shadow masks for color TVs, the copper-foil-laminated sheet in the form of a continuous belt was subjected to a series of the steps of from masking to etching. First, a resist for etching was applied to the entire surface of the electrically conductive layer in the copper-foil-laminated sheet. This sheet was subjected to contact exposure to light using a patterning plate for the desired mesh pattern, and was then subjected to development, film hardening treatment, and baking. Thereafter, by using a ferric chloride solution, the copper foil was etched together with the blackening layer, thereby making openings in the copper foil to form a mesh. The copper foil was then successively subjected to washing with water, resist stripping, cleaning, and drying. As for the mesh layer, the shape of each opening was a regular square; the line width of the line parts, non-opening portions, was 10 μm; the distance between the lines (line pitch) was 300 μm; and the bias angle that is defined as a minor angle with the longer side of the rectangular mesh part 3A (see FIG. 2) was 49 degrees. Etching was conducted in such a way that, when the continuous, belt-like sheet is cut into rectangular sheets in the desired size, non-etched portions that form a 15-mm wide frame part having no openings surround the four sides of each sheet.

Subsequently, the above-described mesh-laminated sheet that had been once rolled up was unrolled, and a coating liquid made from an ionizing-radiation-curing resin composition was intermittently applied, by intermittent die coating, to the mesh layer face of the mesh-laminated sheet in an amount of 25 g/m$^2$ on dry basis, provided that the area coated with the coating liquid was the entire mesh part and a 2.5-mm wide inner peripheral area of the frame part, stretching adjacently to and around the mesh part, thereby forming the transparent barrier layer 5 on the mesh layer face. The coating liquid was an ionizing-radiation-curing resin composition prepared by adding 0.3% by weight of a photopolymerization initiator [Irgacure (trademark) 184 manufactured by Ciba Specialty Chemicals K.K., Japan] to a 1:1 (weight basis) mixture of urethane acrylate oligomer and phenoxyethyl acrylate and diluting this mixture with an organic solvent (a 1:1 (weight basis) solvent mixture of methyl ethyl ketone and toluene).

After applying the coating liquid, the coating film formed was dried to evaporate the solvent, and a shaping sheet, which was a commercially available, 50-μm thick, biaxially oriented polyethylene terephthalate film in a continuous, belt-like form, was placed on this coating film, with its non-adhesion-promoted surface facing to the coating film. After applying ultraviolet light (using a D bulb manufactured by Fusion UV Systems Co., Ltd., Japan) through the shaping sheet to cure the coating film, only the shaping sheet was peeled off, thereby forming a transparent barrier layer 5 in a non-sticky solid state, having a flat surface. Thus, a sheet to be processed was obtained.

Subsequently, a transparent colored resin layer in the form of a colored pressure-sensitive adhesive sheet with separators on both sides was prepared, in order to form, on the flat front surface of the transparent barrier layer, the transparent colored resin layer 4 serving also as an adhesive layer (pressure-sensitive adhesive layer) useful in laminating a functional layer. Namely, to the releasing face of a continuous, belt-like separator with a polyethylene terephthalate film substrate, a colored, acrylic resin pressure-sensitive adhesive (binder) to which a cyanine dye (TY-167 manufactured by ASAHI DENKA KOGYO K.K., Japan), a neon light absorber, had been added in such a proportion that the dye concentration of the transparent colored resin layer would be 0.00325 $g/m^2$ was applied to form a coating film with a uniform thickness (in an amount of approximately 25 $g/m^2$ when calculated in terms of solid matter). After evaporating the solvent, a similar separator was attached to the sticky surface, thereby obtaining a continuous belt-like, colored, pressure-sensitive adhesive sheet with the separators on both sides. This continuous belt-like, colored, pressure-sensitive adhesive sheet was laminated, while removing the separator from one side of this sheet, to a non-colored, transparent, biaxially oriented, 100-μm thick polyethylene terephthalate film in the form of a continuous belt, to be used as a functional layer 8 useful for surface protection, whereby a continuous, belt-like protective sheet with the colored, pressure-sensitive adhesive layer was obtained. The continuous protective sheet with the colored, pressure-sensitive adhesive layer was slit and cut into sheets in such a desired size that the frame part around the four sides of the filter was exposed, thereby obtaining protective sheets with the colored, pressure-sensitive adhesive layer. These protective sheets were intermittently laminated, while removing the separators from the protective sheets, to the above-described continuous belt-like sheet to be processed, in such a manner that the frame part around the four sides of the mesh layer was exposed (the inner peripheral area of the frame part was slightly covered), whereby a laminate shown in FIG. 6(A) was obtained. By cutting this laminate into the desired size, an electromagnetic wave shielding filter 10 shown in FIG. 6(A), in sheet form, was finally obtained.

The lamination of the electromagnetic wave shielding filter 10 shown in FIG. 6(A) is the transparent substrate 1/the transparent adhesive layer 9/the mesh layer 3 (the anticorrosive layer 6/the blackening layer 7/the electrically conductive layer 2/the anticorrosive layer 6)/the transparent barrier layer 5/the transparent colored resin layer 4/the functional layer 8, where the transparent substrate 1 side is the observer side. The symbol "/" herein denotes that two layers written before and after this symbol are integrally laminated to each other, and this shall apply hereinafter.

Example 2

Formation of Blackening Layer on the Other Side of Electrically Conductive Layer An electromagnetic wave shielding filter 10 comprising a blackening layer 7 formed, as shown in FIG. 6(B), on the electrically conductive layer 2 face on the transparent colored resin layer 4 side, opposite to the side on which the blackening layer 7 was formed in Example 1, was produced in the following manner.

An electromagnetic wave shielding filter 10 shown in FIG. 6(B) was produced in the same manner as in Example 1, except that the copper foil covered with the anticorrosive layer was laminated to the transparent substrate, with the non-blackened surface of the copper foil facing to the transparent substrate.

The lamination of the electromagnetic wave shielding filter 10 shown in FIG. 6(B) is the transparent substrate 1/the transparent adhesive layer 9/the mesh layer 3 (the anticorrosive layer 6/the electrically conductive layer 2/the blackening layer 7/the anticorrosive layer 6)/the transparent barrier layer 5/the transparent colored resin layer 4/the functional layer 8, where the transparent colored resin layer 4 side is the observer side.

Example 3

Formation of Blackening Layer on Three Faces of Electrically Conductive Layer

An electromagnetic wave shielding filter 10 comprising a blackening layer 7 formed on the surface and the both side faces of an electrically conductive layer 2, as shown in FIG. 6(C), was produced in the following manner.

In the same manner as in Example 1, a copper-foil-laminated sheet was prepared by using, as the metal foil to be made into the electrically conductive layer 2, electrolytic copper foil that had not been subjected to blackening treatment, and was etched, thereby obtaining a laminate sheet having an electrically conductive layer in the form of a mesh. Subsequently, a blackening layer 7 also having the function of preventing corrosion was formed on three faces, that is, the surface (the face on the side opposite to the transparent substrate side) of the electrically conductive layer, and the both side faces of each opening in the mesh. Specifically, the laminate sheet containing, on the transparent substrate, the electrically conductive layer in the form of a mesh was immersed in a plating bath for blackening treatment, a mixture of an aqueous nickel ammonium sulfate solution, an aqueous zinc sulfate solution, and an aqueous sodium thiocyanate solution, to conduct electrolytic plating, using a nickel plate as the anode, thereby conducting blackening treatment to form a nickel-zinc-alloy-made blackening layer 7 on the above-described three faces, that is, the entire exposed surface of the electrically conductive layer. Thus, there was obtained a mesh-laminated sheet having, on the transparent substrate 1, the mesh layer 3 consisting of the electrically conductive layer 2 and the blackening layer 7. To this mesh-laminated sheet, a transparent barrier layer, a transparent colored resin layer, and a functional layer were successively laminated in the same manner as in Example 1, except that the anticorrosive layer was not formed, whereby an electromagnetic wave shielding filter shown in FIG. 6(C) was obtained.

The lamination of the electromagnetic wave shielding filter 10 shown in FIG. 6(C) is the transparent substrate 1/the transparent adhesive layer 9/the mesh layer 3 (the electrically conductive layer 2/the blackening layer 7 on the surface and the both side faces)/the transparent barrier layer 5/the transparent colored resin layer 4/the functional layer 8, where the transparent colored resin layer 4 side is the observer side.

Example 4

Direct Formation of Electrically Conductive Layer on Transparent Substrate

An electromagnetic wave shielding filter 10 shown in FIG. 6(D), comprising an electrically conductive layer 2 laminated directly to a transparent substrate 1 without using a transparent adhesive layer, and a blackening layer 7 formed on the three faces of the electrically conductive layer 2, that is, the surface and the both side faces of the electrically conductive layer 2, was produced in the following manner.

A non-colored, transparent, 100-μm thick, biaxially oriented polyethylene terephthalate film in the form of a continuous belt was prepared as the transparent substrate 1. By conducting vacuum deposition, a copper layer with a thickness of 0.5 μm (a part of the electrically conductive layer) was formed, as a conductive treatment layer, on one surface of the above transparent substrate. A copper layer with a thickness of 10 μm (the remaining part of the electrically conductive layer) was formed on the conductive treatment layer face by electrolytic plating. Thus, there was obtained a copper-laminated sheet containing the electrically conductive layer 2 consisting of the two copper layers, formed directly on the transparent substrate.

By repeating the same subsequent steps as in Example 3, an electromagnetic wave shielding filter shown in FIG. 6(D) was obtained.

The lamination of the electromagnetic wave shielding filter 10 shown in FIG. 6(D) is the transparent substrate 1/the mesh layer 3 (the electrically conductive layer 2/the blackening layer 7 on the surface and the both side faces)/the transparent barrier layer 5/the transparent colored resin layer 4/the functional layer 8, where the transparent colored resin layer 4 side is the observer side.

Comparative Example 1

Figure 7:
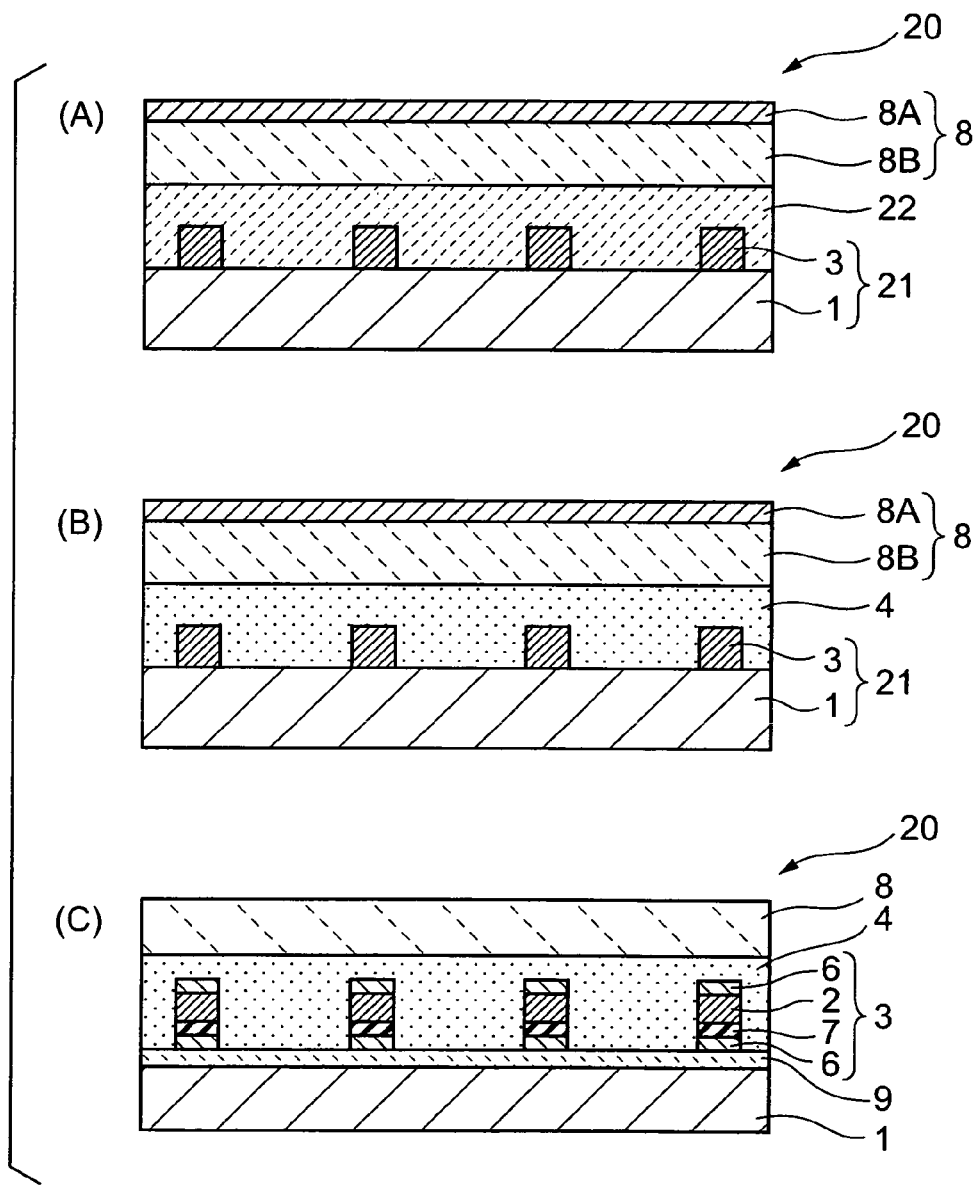
FIGS. 7(A) to 7(C) are sectional views illustrating some forms of conventional electromagnetic wave shielding filters.

An electromagnetic wave shielding filter 20 having the structure shown in FIG. 7(C) was produced in the same manner as in Example 1, except that the transparent barrier layer was not formed. Specifically, an electromagnetic wave shielding filter 20 shown in FIG. 7(C) was produced in the same manner as in Example 1, except that the protective sheets in the desired size, covered with the colored, pressure-sensitive adhesive layer, were laminated to the continuous belt-like, mesh-laminated sheet in the state of being not provided with the transparent barrier layer, and that, after cutting this laminate into final sheets in the desired size, the air bubbles incorporated due to the difference in level produced by the mesh layer and remaining even after the laminating step, were removed in an autoclave at 1 MPa (10 atom) and 80° C. over 1 hour.

The lamination of the electromagnetic wave shielding filter 20 shown in FIG. 7(C) is the transparent substrate 1/the transparent adhesive layer 9/the mesh layer 3 (the anticorrosive layer 6/the blackening layer 7/the electrically conductive layer 2/the anticorrosive layer 6) the transparent colored resin layer 4/the functional layer 8, where the transparent substrate 1 side is the observer side.

[Performance Assessment]

Performance assessment was carried out in the following manner: before and after heating at 80° C. for 1,000 hours, the color tone of each one of the electromagnetic wave shielding filters of Examples and Comparative Example (the whole electromagnetic wave shielding filter including not only the transparent colored resin layer but also the other constituent layers) was determined by a spectrocolorimeter (CM-3600d manufactured by KONICAMINOLTA SENSING CO., LTD., Japan) in order to obtain the color difference $\Delta E*Lab$, which is defined as $\Delta E*Lab=\{(\Delta L*)^2+(\Delta a*)^2+(\Delta b*)^2\}^{0.25}$ in the $L*a*b*$ color system provided by CIE (International Commission on Illumination, 1976). The measurement was made by using standard light $D_{65}$ at a viewing angle of 2° in transmission mode.

The results are as shown in Table 1. The color difference obtained from the electromagnetic wave shielding filters of Examples are 2.0 or less; while the color difference obtained from the electromagnetic wave shielding filter of Comparative Example is more than 4 that is in excess of two times the color differences obtained from the electromagnetic wave shielding filters of Examples. Thus, the change in color that the electromagnetic wave shielding filters of Examples had undergone was little, and it was thus confirmed that these filters had been improved.

TABLE 1

Results of Performance Assessment

| | Color Difference $\Delta E*Lab$ (before and after heating at 80° for 1000 hrs.) |
|---|---|
| Example 1 | 1.9 |
| Example 2 | 1.8 |
| Example 3 | 2.0 |
| Example 4 | 1.9 |
| Comp. Ex. 1 | 4.1 |

The invention claimed is:

1. An electromagnetic wave shielding filter comprising:
   a transparent substrate,
   a transparent adhesive layer made from a urethane adhesive, formed on the transparent substrate,
   a mesh layer in the form of a mesh, containing at least an electrically conductive layer made from a metal, formed on the transparent adhesive layer, and
   a transparent colored resin layer containing a coloring agent and an adhesive, formed on the mesh layer,
   a transparent barrier layer for separating the mesh layer and the transparent colored resin layer from each other, made from a non-urethane, non-adhesive solid resin, being present between the mesh layer and the transparent colored resin layer.

2. The electromagnetic wave shielding filter according to claim 1, wherein
   the mesh layer contains an anticorrosive layer formed at least on one side of the electrically conductive layer.

3. The electromagnetic wave shielding filter according to claim 1, wherein
   the mesh layer contains a blackening layer formed at least on one side of the electrically conductive layer.

4. The electromagnetic wave shielding filter according to claim 1, wherein
   the mesh layer contains a blackening layer, the electrically conductive layer, and an anticorrosive layer that are situated in this order, with the blackening layer on the transparent substrate side.

5. The electromagnetic wave shielding filter according to claim 1, wherein
   the mesh layer contains the electrically conductive layer, a blackening layer, and an anticorrosive layer that are situated in this order, with the electrically conductive layer on the transparent substrate side.

6. The electromagnetic wave shielding filter according to claim 1, wherein
   the mesh layer contains a first anticorrosive layer, a blackening layer, the electrically conductive layer, a blackening layer, and a second anticorrosive layer that are situated in this order, with the first anticorrosive layer on the transparent substrate side.

7. The electromagnetic wave shielding filter according to claim 1, wherein
the mesh layer contains a first anticorrosive layer, the electrically conductive layer, a blackening layer, and a second anticorrosive layer that are situated in this order, with the first anticorrosive layer on the transparent substrate side.

8. The electromagnetic wave shielding filter according to claim 1, wherein
the mesh layer contains the electrically conductive layer, and a blackening layer that covers a face of the electrically conductive layer on the side opposite to the transparent substrate side and the side faces of the electrically conductive layer.

9. The electromagnetic wave shielding filter according to claim 1, wherein
the transparent colored resin layer functions as an adhesive layer, and a functional layer is laminated to the transparent colored resin layer.

10. The electromagnetic wave shielding filter according to claim 1, further comprising:
a transparent adhesive layer between the transparent substrate and the mesh layer.

11. The electromagnetic wave shielding filter according to claim 1, wherein
the mesh layer contains a blackening layer formed, either directly or through an anticorrosive layer, on one or more faces selected from a face of the electrically conductive layer on the transparent substrate side, a face of the electrically conductive layer on the side opposite to the transparent substrate side, and the side faces of the electrically conductive layer.

* * * * *